US007166966B2

(12) United States Patent
Naugler, Jr. et al.

(10) Patent No.: US 7,166,966 B2
(45) Date of Patent: \*Jan. 23, 2007

(54) PENLIGHT AND TOUCH SCREEN DATA INPUT SYSTEM AND METHOD FOR FLAT PANEL DISPLAYS

(75) Inventors: W. Edward Naugler, Jr., Cedar Park, TX (US); Damoder Reddy, Los Gatos, CA (US)

(73) Assignee: Nuelight Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/054,350

(22) Filed: Feb. 8, 2005

(65) Prior Publication Data

US 2005/0200293 A1 Sep. 15, 2005

Related U.S. Application Data

(63) Continuation of application No. 11/015,638, filed on Dec. 17, 2004.

(60) Provisional application No. 60/583,744, filed on Jun. 29, 2004, provisional application No. 60/547,358, filed on Feb. 24, 2004.

(51) Int. Cl.
*H05B 37/02* (2006.01)
*G05G 3/10* (2006.01)
*G09G 3/32* (2006.01)

(52) U.S. Cl. .................. 315/149; 315/169.2; 345/82
(58) Field of Classification Search ................ 315/149, 315/150, 151, 169.2; 345/82
See application file for complete search history.

(56) References Cited

U.S. PATENT DOCUMENTS

| | | | |
|---|---|---|---|
| 4,587,459 A | 5/1986 | Blake | |
| 4,897,672 A | 1/1990 | Horiuchi et al. | |
| 4,951,041 A | 8/1990 | Inada et al. | |
| 4,975,691 A | 12/1990 | Lee | |
| 5,075,596 A | 12/1991 | Young et al. | |
| 5,093,654 A | 3/1992 | Swift et al. | |
| 5,121,146 A | 6/1992 | Smith et al. | |
| 5,231,382 A | 7/1993 | Tanaka | |

(Continued)

FOREIGN PATENT DOCUMENTS

EP 0 923 067 A1 6/1998

(Continued)

*Primary Examiner*—Trinh Vo Dinh
(74) *Attorney, Agent, or Firm*—Howrey LLP; Vinay V. Joshi

(57) ABSTRACT

System, device, and method for receiving or sensing touch or light input to an emissive display such as to a OLED display using the same or different sensors as are used to sense and maintain a pixel luminance. Penlight and touch screen data input system and method for display. A sidelight illuminated display and touch panel input device. Method and device for reading display pixel emission and ambient luminance levels. Emissive display having sensing for luminance stabilization and user light or touch screen input. Method and device for emissive display using shielded or partially shielded sensors. Emissive pixel display device characterized in that photon sensors are disposed within pixels and operated to sense photons emitted by emitter within pixel and ambient photons emitted by sources outside pixel, sensed internally emitted photons being for luminance feedback control and sensed ambient photons being used to detect external light source or sources.

18 Claims, 15 Drawing Sheets

U.S. PATENT DOCUMENTS

| | | | |
|---|---|---|---|
| 5,235,243 A | 8/1993 | Sato | |
| 5,283,500 A | 2/1994 | Kochanski | |
| 5,287,205 A | 2/1994 | Yamazaki et al. | |
| 5,323,408 A | 6/1994 | Hahn et al. | |
| 5,357,172 A | 10/1994 | Lee et al. | |
| 5,386,179 A | 1/1995 | Sato | |
| 5,387,844 A | 2/1995 | Browning | |
| 5,396,150 A | 3/1995 | Wu et al. | |
| 5,410,218 A | 4/1995 | Hush | |
| 5,463,279 A | 10/1995 | Khormaei | |
| 5,581,159 A | 12/1996 | Lee et al. | |
| 5,594,463 A | 1/1997 | Sakamoto | |
| 5,661,645 A | 8/1997 | Hochstein | |
| 5,739,641 A | 4/1998 | Nakamura et al. | |
| 5,751,267 A | 5/1998 | Sato et al. | |
| 5,754,150 A | 5/1998 | Matsui | |
| 5,783,909 A | 7/1998 | Hochstein | |
| 5,940,058 A | 8/1999 | Koyama | |
| 5,962,845 A | 10/1999 | Yee | |
| 5,973,456 A | 10/1999 | Osada et al. | |
| 6,081,073 A | 6/2000 | Abdel | |
| 6,229,506 B1 | 5/2001 | Dawson et al. | |
| 6,229,508 B1 | 5/2001 | Kane | |
| 6,396,217 B1 | 5/2002 | Weindorf | |
| 6,414,661 B1 | 7/2002 | Shen et al. | |
| 6,441,560 B1 | 8/2002 | Hunter | |
| 6,483,492 B1 | 11/2002 | Takeuechi et al. | |
| 6,489,631 B2 | 12/2002 | Young et al. | |
| 6,498,592 B1 | 12/2002 | Matthies | |
| 6,518,941 B1 | 2/2003 | Kimura | |
| 6,522,315 B2 | 2/2003 | Ozawa et al. | |
| 6,529,178 B1 | 3/2003 | Kimura | |
| 6,529,213 B1 | 3/2003 | Kimura | |
| 6,542,137 B2 | 4/2003 | Kimura et al. | |
| 6,542,138 B1 | 4/2003 | Shannon et al. | |
| 6,603,499 B2 | 8/2003 | Wong et al. | |
| 6,618,185 B2 | 9/2003 | Sandström | |
| 6,642,665 B2 | 11/2003 | Kimura | |
| 6,693,610 B2 | 2/2004 | Shannon et al. | |
| 6,720,942 B2 | 4/2004 | Lee et al. | |
| 6,738,031 B2 | 5/2004 | Young et al. | |
| 6,781,567 B2 | 8/2004 | Kimura | |
| 2005/0140611 A1* | 6/2005 | Shih et al. | 345/82 |
| 2005/0200291 A1* | 9/2005 | Naugler et al. | 315/149 |
| 2005/0200292 A1* | 9/2005 | Naugler et al. | 315/149 |

FOREIGN PATENT DOCUMENTS

| | | |
|---|---|---|
| JP | 2002-144634 | 5/2002 |
| WO | WO 99/53472 | 10/1999 |
| WO | WO 03/038790 A2 | 5/2003 |
| WO | WO 03/038798 A2 | 5/2003 |
| WO | WO 2004/027744 A1 | 4/2004 |
| WO | WO 2004/072937 A2 | 8/2004 |
| WO | WO 2004/072938 A2 | 8/2004 |
| WO | WO 2004/072940 A1 | 8/2004 |
| WO | WO 2004/084168 A1 | 9/2004 |

* cited by examiner

Use of OLED material as a photodiode.

PENLIGHT AND TOUCH SCREEN DATA INPUT SYSTEM AND METHOD FOR FLAT PANEL DISPLAYS

RELATED APPLICATIONS

This application claims benefit of priority under 35 U.S.C. § 119 and/or §35 U.S.C. § 120 to the following applications: U.S. Provisional Patent Application Ser. No. 60/547,358 filed on 24 Feb. 2004 and entitled Penlight and Touch Screen Data Input System for Flat Panel Displays; U.S. Provisional Patent Application Ser. No. 60/583,744 filed 29 Jun. 2004 and entitled High-Impedance to Low-Impedance Conversion. The present application is a continuation to U.S. patent application Ser. No. 11/015,638 filed 17 Dec. 2004 and entitled Feedback Control System and Method for Operating a High-Performance Stabilized Active Matrix Emissive Display; each of which applications is hereby incorporated by reference.

U.S. patent application Ser. No. 11/054,708 filed Feb. 08, 2005 and entitled *Sidelight Illuminated Flat Panel Display and Touch Panel Input Device*; U.S. patent application Ser. No. 11/054,320 filed Feb. 08, 2005 and entitled *Method and Device for Reading Display Pixel Emission and Ambient Luminance Levels*; U.S. patent application Ser. No. 11/054,332 filed Feb. 08, 2005 and entitled *Emissive Display Device Having Sensing for Luminance Stabilization and User Light or Touch Screen Input*; and U.S. application Ser. No. 11/054,324 filed Feb. 08, 2005 and entitled *Method and Device for Flat Panel Emissive Display Using Shielded or Partially Shielded Sensors to Detect User Screen Inputs*; each of which applications are hereby incorporated by reference.

FIELD OF THE INVENTION

This invention pertains generally to systems, devices, and methods for receiving or sensing contact and non-contact inputs to the surface of an emissive display device, and more particularly to systems, devices, and methods for receiving or sensing a touch or light input to a flat panel organic light emitting diode (OLED) display panel using the same or different sensors as are used to sense and maintain a pixel luminance.

BACKGROUND OF THE INVENTION

Many display applications such as personal data assistants (PDAs), global positioning systems (GPS) and navigation systems incorporating GPS, airline check-in terminals, public computer kiosks, as well as a variety of other system and devices include touch screens that are added onto an information display panel so that a user may effectively see an icon or graphic for a data item or action, and by pressing a finger or stylus on that icon, select data item or action.

Conventional devices routinely provide a separate touch panel that is placed on top of the display so that even though a user may believe he or she is touching the display screen, in fact her/she is providing an input to a separate device attached to the display panel or otherwise interposed between the user and the display device.

These devices therefore must include not only the two panels for the touch input and information display, but must also provide the separate electronic and interfaces to the device and in some instances provide separate driver, operating system, and or application program software for the touch input panel and display panels. Assembly and maintenance costs may also typically increase. All of these additional components add to the cost of the device and where competition is high and profit margins small, the additional cost is unwelcome. In some devices the cost of adding a touch panel to a display panel may double the cost as compared to the display panel alone when it is added after original manufacture.

There is therefore a need for an integrated single low-cost display device that can not only display or output two-dimensional symbolic and graphical information generated by the device, but also includes a sensor array that can receive position sensitive input from a user and communicate such position information to the device.

There is also a need for a sensor array that can be integrated with a display during the manufacture of the display so that the additional cost to manufacture and distribute the input sensor array as a touch screen is of nominal cost.

There is also a need in some environments to provide a non-contact input such as in the form of a pen-light input, so that abrasion and other wear or damage that might result from repeated touching pressure on the input device is reduced thereby extending the life of the device in severe service environments. There is also a need to provide a contact input that does not rely on an external light source such as ambient light or a light pen.

SUMMARY

This invention provides system, display device, pixel and sensor architecture, and methods for receiving or sensing contact and non-contact inputs (such as a light pen input) to the surface of an emissive display device, and more particularly to systems, devices, and methods for receiving or sensing a touch or light input to a flat panel display such as to a flat panel organic light emitting diode (OLED) display or other emissive display panel, using the same or different sensors as are used to sense and maintain a pixel luminance.

In one aspect, the invention provides a penlight and touch screen data input system and method for flat panel displays, in another aspect the invention provides a sidelight illuminated flat panel display and touch panel input device, in another aspect the invention provides a method and device for reading display pixel emission and ambient luminance levels, in another aspect the invention provides a emissive display device having sensing for luminance stabilization and user light or touch screen input, in another aspect the invention provides a method and device for flat panel emissive display using shielded or partially shielded sensors to detect user screen inputs.

In another aspect, the invention provides an emissive pixel display device of the type having a plurality of pixels, where each pixel has a light emitting device and a drive circuit generating a drive signal for driving the display pixels, the emissive pixel display device characterized in one way in that at least one photon sensor is disposed within a display device pixel and operated so that it senses photons emitted by an emitter within the pixel and ambient photons emitted by sources outside the display device, the sensed internally emitted photons being for display luminance feedback control and the sensed ambient photons being used to detect an external light source or sources or shadow input to the display.

In yet another aspect, the invention provides method, display, pixel structure, and emissive pixel device having an integrated luminance and input sensor, wherein the pixel device includes a light emitting device; a pixel emitter drive circuit generating a current to drive the light emitting device to a predetermined luminance corresponding to an image voltage and applying the drive current to the light emitting device during a frame time; at least one photo sensor that exhibits a change in electrical characteristic in response to a change in incident photon flux disposed near the light emitting device to: (i) intercept a measurable photon flux when the light emitting device is in an emitting state, and (ii) to detect a measurable photon flux from a source outside the pixel when the light emitting device is not in an emitting state; and at least one of a voltage, current, and charge reading circuit for measuring: (i) a first voltage across, a first current from, or a first charge generated by the photo sensor device at the end of a first portion of a non-emitting time period during a non-light emitting state, and wherein the measured first voltage, first current, or first charge being an indication of a measured luminance emitted from a source outside the pixel during the first portion of the time period; and (ii) a second voltage across, a second current from, or a second charge generated by the photo sensor device at the end of a second portion of an emitting time period during the light emitting state, and wherein the measured second voltage, second current, or second charge being an indication of a measured luminance emitted from the pixel during a second portion of the time period.

In still another aspect, the invention provides a method of operating an emissive pixel device having an integrated luminance and input sensor, the method comprising: generating a current to drive a light emitting device to a predetermined luminance corresponding to an image voltage and applying the drive current to the light emitting device during a frame time; coupling at least one charge storage device with the sensor for accumulating or releasing charges and exhibiting a capacitance charge and voltage proportional to the charge at a time; exposing the sensor that exhibits a change in electrical characteristic in response to a change in incident photon flux to photons emitted by the light emitting device during the a first time period and a second time period; accumulating (charge) or draining (discharge) charges to or from the at least one charge storage device coupled with the sensor, the sensor including a component that controls the rate of accumulation or release of charges during the first and second time periods; measuring a voltage or current arising from the charges present on the charge storage device at the end of a portion of the first and second time periods, the measured voltage or current during the portion of the first period being an indication of an actual luminance emitted from the pixel during the portion of the first time period, and the measured voltage or current during the portion of the second period being an indication of an actual luminance incident upon the pixel sensor from an external source during the portion of the second time period; comparing the actual luminance emitted from the pixel related measured voltage or current with a reference target pixel luminance for the pixel emitter image voltage and pixel emitter drive current to generate a difference value; applying the difference value as a feedback input to a correction circuit that modifies the image voltage and drive current for the same pixel during a subsequent frame time; and comparing the actual luminance incident upon the pixel sensor during the portion of the second time period with actual luminance for at least one other pixels in the display to identify a touched or light pen input location on the display.

In yet another aspect, the invention provides device and method for detecting an input to a display device having a first plurality of separately addressable picture element (pixel) locations arranged as a two-dimensional array, the method including: providing a photon sensing element proximate at least some of the first plurality of separately addressable pixel locations in the two-dimensions of the array; detecting photons impinging on each of the sensing elements during predetermined detection time periods; generating a sensed signal for each of the photon sensing elements corresponding to the number or energy of the detected photons; and analyzing the sensed signals to identify at least one pixel location that has received an input.

In even still another aspect, the invention provides A method of operating an emissive pixel device having an integrated luminance and input sensor, the method comprising: generating a current to drive a light emitting device in each pixel to a predetermined luminance corresponding to an image voltage and applying the drive current to the light emitting device during a frame time; providing at least one photo sensor that exhibits a change in electrical characteristic in response to a change in incident photon flux near the light emitting device in each pixel to: (i) intercept a measurable photon flux when the light emitting device is in an emitting state, and (ii) to detect a measurable photon flux from a source outside the pixel when the light emitting device is not in an emitting state; reading at least one of a voltage, current, and charge measurement representing: (i) a first voltage across, a first current from, or a first charge generated by the photo sensor device at the end of a first portion of a non-emitting time period during a non-light emitting state, and wherein the measured first voltage, first current, or first charge being an indication of a measured luminance emitted from a source outside the pixel during the first portion of the time period; and (ii) a second voltage across, a second current from, or a second charge generated by the photo sensor device at the end of a second portion of an emitting time period during the light emitting state, and wherein the measured second voltage, second current, or second charge being an indication of a measured luminance emitted from the pixel during a second portion of the time period.

In still a further aspect, the invention provides a device for detecting an input to a display device having a first plurality of separately addressable picture element (pixel) locations arranged as a two-dimensional array, the device comprising: a photon sensing element proximate at least some of the first plurality of separately addressable pixel locations in the two-dimensions of the array; at least one detection circuit detecting photons impinging on each of the sensing elements during predetermined detection time periods; at least one measurement circuit generating a sensed signal for each of the photon sensing elements corresponding to the number or energy of the detected photons; and a comparison circuit for comparing and analyzing the sensed signals to identify at least one pixel location that may have received an input.

In still another aspect, the invention provides a device and method for detecting an input to a display device having a first plurality of separately addressable picture element (pixel) locations arranged as a two-dimensional array, the device comprising: a photon sensing element proximate at least some of the first plurality of separately addressable pixel locations in the two-dimensions of the array; at least one detection circuit detecting photons impinging on each of the sensing elements during predetermined detection time periods; at least one measurement circuit generating a sensed signal for each of the photon sensing elements corresponding to the number or energy of the detected photons; and a comparison circuit for comparing and analyzing the sensed signals to identify at least one pixel location that may have received an input.

In still another aspect, the invention provides An emissive pixel display device comprising: a plurality of light emitting devices arranged in a two-dimensional array as a display screen; a pixel emitter drive circuit to drive the plurality of light emitting devices to predetermined luminance; at least one photo sensor associated with each light emitting device that exhibits a change in electrical characteristic in response to a change in incident photons to: (i) intercept a photons when the light emitting device is in an emitting state, and (ii) to detect photons from a source outside the pixel when the light emitting device is not in an emitting state; at least one of a voltage, current, and charge reading circuit for measuring: (i) a first electrical parameter associated with the photo sensor for a non-emitting time as an indication of a luminance emitted from a source external to the pixel and display; and (ii) a second electrical parameter associated with the photo sensor for a emitting time as an indication of a luminance emitted from the pixel internal to the pixel and display.

In still another aspect, the invention provides for a display device or panel that incorporate embodiments of the pixel structures and devices, sensor structures and devices, and the circuits and operating methods and procedures described relative thereto. For example, the invention provides flat panel display devices for use in computing, entertainment, television, personal data assistants, automobile display devices, graphic display devices, home appliances, and/or any other information or display device.

Other aspects, features, and advantages or the invention are described in the text and illustrated in the drawings or set forth in the claims.

DETAILED DESCRIPTION OF EXEMPLARY EMBODIMENTS

Figure 1:
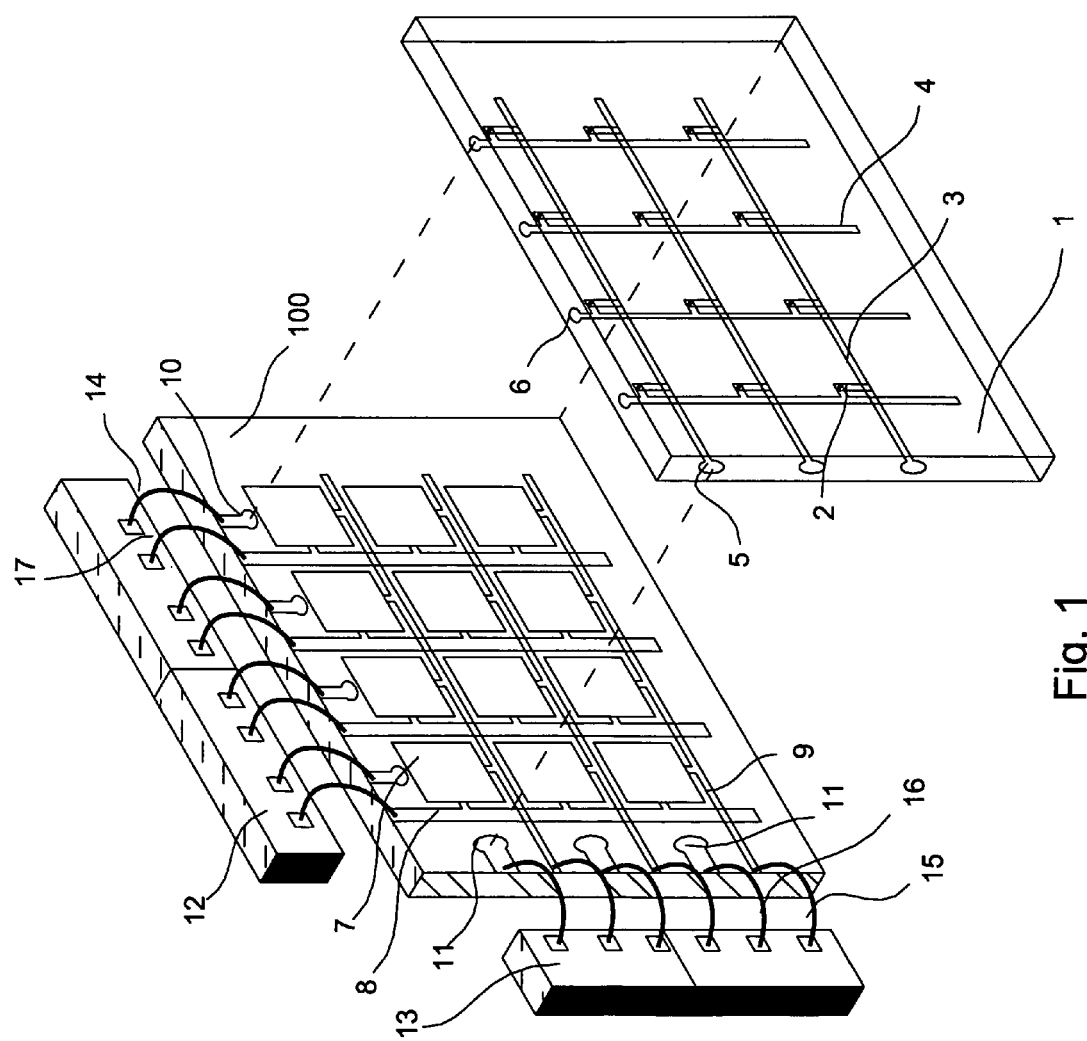
FIG. 1 is an illustration showing an embodiment of an OLED pixel array on a glass substrate aligned with an optical sensor array also on a glass substrate.

U.S. patent application Ser. No. 10/872,268 filed 17 Jun. 2004 and entitled Controlled Passive Display, Apparatus and Method for Controlling and Making a Passive Display; U.S. patent application Ser. No. 10/841,198 filed 6 May 2004 and entitled Method and Apparatus for Controlling A Light Source; U.S. patent application Ser. No. 10/515,575 filed 19 Nov. 2004 and entitled Passive Matrix Emission Stabilized Flat Panel Display; and U.S. patent application Ser. No. 10/872,344 filed 17 Jun. 2004 and entitled Method and Apparatus for Controlling an Active Matrix Display; describe various aspects of flat display panel technology and more particularly organic light emitting diodes (OLED) display technology. Each of these patent applications are hereby incorporated by reference.

Among the structures, methods, and features described are included structures for constructing an array of optical sensors that are a 1-for-1 match to the pixel array of an OLED display. For every OLED pixel there is one optical sensing device. Since the feedback-stabilized display has a built-in sensor array, there is an opportunity to use the optical sensor array to also input data to the computer or other device or circuit that controls and drives the OLED display. Thus the optical sensor array may not only stabilize the display but may also be used as a light input or touch screen.

Several different approaches to using the optical sensors arrays as an input means are possible. In one embodiment, in order to use the optical sensor arrays that are already provided and used to stabilize brightness, luminance, and/or other pixel emission or transmission characteristics of an OLED display as a touch screen, stylus, or penlight input device, a portion of the line address time period is used to scan the optical sensors and detect which sensors in the array are exposed to the light from an input device such as an LED-based penlight device or a light-scattering touch plate. Alternatively, because ambient light may usually fall on the optical sensors in most operating environments, there is virtually always a background voltage showing on the pixel feed back circuit due to the ambient light detected by the sensor or sensing circuit. If a shadow falls on one or a group of array sensors, this shadow will be detected when the array sensors are scanned during the section of the line address devoted to detecting input data and or ambient data.

Many typical displays use 30 to 60 frames per second (fps) refresh rates. A refresh rate of 60 fps means the frame address time is 16.67 milliseconds (1/60). If the display has 100 lines then the line address time is 16.67÷100 or 167 microseconds. At the beginning of each line scan the pixel in the line are turned off; therefore, the only light on the line in the optical sensor array will be from the ambient light in the display operating environment (such as room light) or from the light input device (for example from an emissive light pen or from light scattered from a scattering plate). For this example, if twenty-percent (20%) or one-fifth of the line write time (167÷5=33.4) is used to scan the voltages in the feedback circuit for the sensors, then about a 33-microsecond time slot or period (or some fraction of this) may be dedicated for the detecting of external light input. This will leave about 134 microseconds for the line write. The circuitry to detect the voltages on the feedback circuit are integrated into the driving integrated circuit (IC) electronics and logic used to drive the display and manage the feedback circuit for the display luminance control and stabilization. The details of that type of circuitry are well known within electrical engineering field and to persons educated and trained in the electronics field and are not described in greater detail here.

There are many structures and methods for inputting light information to a sensor rich display screen. The following is a series of examples are provided by way of example but not by way of limitation, and it will be appreciated in light of the description provided herein that many other structures and methods may be implemented.

In a first exemplary embodiment, an input device in the shape of an ordinary ink pen or stylus is used but instead of ink or some other marking material, the pen contains a light emitting diode (LED) that emits light or a stream of photons. Examples of such LED are LEDs that emit in the visible or infrared wavelengths, such as a red LED or an infrared LED. Other white, monochromatic, polychromatic, or color LEDs may alternatively be used, and/or the LED may emit over a wavelength range or are polychromatic. Monochromatic LEDs may however be preferred as it permits an optimum combination of light input with suppression of other ambient light that is not at that wavelength. Other embodiments may use incandescent light sources. Fiber optics and/or lens systems may be used to communicate the light from a source internal or external to the light pen to the tip of the pen. An optical lens system within the pen and/or at the tip of the pen focuses the light to a fine point on the optical sensor array. Alternatively, the optical system may generate a substantially collimated beam that exits the pen near to or at the tip. The pen may advantageously be designed to ride on the surface of the front glass plate of the display that contains the sensor array on the inside surface of the glass plate or other transparent surface. Since the pen rides on the outside surface and advantageously focuses on the inside surface to provide as small of a spot as possible, in one embodiment the pen-based lens systems' focal length may be substantially the distance from the lens system to the sensor array, or about the thickness of the glass.

Various optical techniques are known in the art for relaying images and for generating a spot at a desired location in space, so that the optical system need not be a simple lens located at the tip of the light pen. Therefore it will be appreciated that any optical system or technique known in the art may be applied to produce the desired spot, focused bean, collimated beam, or other photon concentration that may interface with and be detected by one or a small number of sensors. Since the distance from the tip of the pen to the sensor array remains fixed the lens system may also remain fixed and does not need to accommodate an expensive adjustable design.

Dark shields are advantageously provided for each member of the sensor array to block or attenuate light and are used to block out or mask all or a significant portion of the ambient light so that the sensing performed to detect the luminance or photon stream emitted by each pixel in the display is not unduly disturbed by ambient light conditions. Dark shields are opaque structures interposed between the sensor and ambient or external light sources and the sensor, but do not obstruct light emitted by the pixel emitter. Dark shields are often constructed of deposited metal or can be advantageously formed from opaque pigmented materials; for example, polyimide materials as are know to those in the industry. Dark shields can also be formed from filter material that block most of the ambient light, put pass a narrow band in the spectrum such as the 710 nanometer wave length perceived as red.

Therefore, the dark shield when used in combination with a light input system, is not absolutely opaque, but is advantageously actually a filter material that blocks out or attenuates most of the ambient light, but will pass light that matches or allows substantial transmission the particular wavelength of the LED in the pen. For example, if the LED is a red LED emitting around 710 nm then the dark shield is advantageously a 710 nm notch filter or as close to such notch filter as may be fabricated. The LED can be of any color and the matching filter can be of any wavelength as long as it matches or substantially matches the LED wavelength in the pen. Of course the filter pass wavelength range and the LED emission wavelength ranges must have at least some spectral wavelength range overlap. The resolution of the pen light input system can be as high as the pixel resolution of the display itself. This means that the input system could be used to accurately record block or cursive handwriting or the input of other graphic or symbolic data or information such as fingerprints.

In a second embodiment, the human finger can be used to shadow the sensor array from ambient light. This would be a relatively coarse input system, but accurate enough for activating icons on the display. Furthermore, the ambient light would need to be of sufficient intensity on the display that the shadow was detectable relative to unshadowed sensors.

In a third embodiment, the phenomenon of total internal reflection in plate is utilized. It is known that light entering the edge of a plate made from any transparent material in a wide range of optical densities (indices of refraction) will travel from one side of the plate to the other without light exiting the top and bottom faces of the plate provided the optical densities of the plate and the materials in contact with the plate are properly selected. Ordinary glass surrounded by transparent materials of higher optical density work well. Thus, a plate of glass or methylmethacrylate plastic can be attached to the front of the OLED display and sensor array. Red LEDs can direct light into one side of the plate without any LED light impinging on the sensors array because absent some disturbance the light will propagate entirely within the plate. If, however, on object is touched to the plate, the change in optical interface between the two materials will be sufficient to cause light to exit the face of the plate at the point where the plate is touched and illuminate the object that is touching the plate. If the object is made of or coated with a reflective material (a white material for example, or a color that is highly reflective to the wavelength of light in the plate) the light will be scattered to the sensors in the array nearest to the point where the scattering plate was touched. This type of light input does not have the relatively higher resolution of the light pen, but if a narrow tipped stylus is used the resolution is better than using a relatively larger finger tip. The finger can also be used to scatter the side-inputted light. The advantage of this input system is that an inert object can be used as a stylus or the finger can be used and the condition of the ambient light is not of consequence as it is in the shadowing technique.

In a fourth embodiment, an image may be input rather than merely a location on the screen. For example, the image of a finger print can be input to the optical sensor array and captured by placing the image on the surface of the display glass (such as by using ink or by picking up the moisture or oils from the finger) and shadowing light through that image from any source of external light. It will be appreciated that the resolution increases if collimated light is used as the external source. In an alternative to this direct input, a system may be implemented in which a thin material such as cellophane can be attached to the front of the display with a dispensing roll on one side and a take-up spool on the other side. Between the cellophane and display glass is provided an optical medium such as glycerin which matches the optical density of the scattering plate. The cellophane rides on or within a glycerin layer that contacts both the scattering plate and the cellophane. This makes the cellophane the light containing top wall. When a finger is pressed against the cellophane light will scatter off the ridges that define the fingerprint and be recorded in the sensor array. Other means and methods for generating a region of light at the surface of the display or for generating a plurality of regions of light such as in the form of an image may be employed.

Additional embodiments are set forth throughout this specification and in the drawings and the claims so that the invention is not limited to the particular embodiments set forth above. Furthermore, it will be understood in light of the description provided here that various aspects and features of the inventive structure and method may be used separately or in any combination and that certain embodiments are described with optional features that improve the performance or operability but are not required.

Attention is now directed to several embodiments of sensor arrays. FIG. 1 shows an embodiment of a display panel substrate, such as an OLED display substrate 100, aligned with sensor plate 1. On sensor plate 1 are the sensor elements 2. The OLED display substrate 100 has disposed on it an array of OLED pixels 7. Sensor plate 1 has formed or disposed on it a sensor array 20 of light (photon) or optical sensors 2. (The sensor plate 1 may alternatively be formed integral with the display substrate so that a physically separate plate is not required.) It is understood that the optical sensors can be optical resistors, optical diodes, optical transistors, or any other device that undergoes a detectable change that can be sensed or measured in response to changes in a light level, luminance, or photon flux change. The optically active material may be selected from among any number of materials including but not limited to any one or combination of silicon, amorphous silicon, cadmium selenide, and poly-silicon. Not shown, to prevent obscuration of the sensors and other inventive features for this array, are any circuit elements not related directly to sensing, such as for example any isolation Thin-Film Transistors (TFTs) or other devices or circuits that are to prevent cross talk of and between the sensors. Such structures are illustrated in the co-pending patent applications identified and incorporated herein or know by workers having ordinary skill in the art.

The sensor array 20 has electrical contacts 5 and 6 that mate with or otherwise couple to contact pads 10 and 11 respectively when the sensor array and OLED display substrates are brought together. The sensor array 20 operates to cause feedback to the driving circuits section of the OLED display to maintain steady brightness and uniformity across the display. Examples of such driving circuitry are described in one or more of U.S. patent application Ser. No. 10/872,268 filed 17 Jun. 2004 and entitled Controlled Passive Display, Apparatus and Method for Controlling and Making a Passive Display; U.S. patent application Ser. No. 10/841,198 filed 06 May 2004 and entitled Method and Apparatus for Controlling A Light Source; U.S. patent application Ser. No. 10/515,575 filed 19 Nov. 2004 and entitled Passive Matrix Emission Stabilized Flat Panel Display; and U.S. patent application Ser. No. 10/872,344 filed 17 Jun. 2004 and entitled Method and Apparatus for Controlling an Active Matrix Display; or where conventional driving circuits may be used, as are known in the art.

The present invention describes a sensor array that is able to not only control the brightness or luminance uniformity of the OLED or other display, but may also be used as an input device operating somewhat analogously to computer touch screen or light pen input devices. The sensor array may for example be used as a touch screen without modification of the sensor system on the glass substrate. In other words, for an active matrix with emissive feedback implementation, the touch screen sensing system may be simultaneously be the emissive feedback sensor system, and vice versa.

Therefore in one aspect, the invention provides a method for detecting an input to a display device having a first plurality of separately addressable picture element (pixel) locations arranged as a two-dimensional array. In one embodiment, the method includes providing a photon sensing element proximate at least some of the first plurality of separately addressable pixel locations in the two-dimensions of the array, detecting photons impinging on each of the sensing elements during predetermined detection time periods, generating a sensed signal for each of the photon sensing elements corresponding to the number or energy of the detected photons, and analyzing the sensed signals to identify at least one pixel location that has received an input.

In another embodiment, the method may provide that the plurality of sensing elements has a corresponding OLED pixel aligned with it. A photon sensing element may be provided proximate each of the first plurality of separately addressable pixel locations. The sensing elements provided proximate each of the pixel locations may comprise sensing elements provided within the structure of each pixel at the pixel location. A photon sensing element may be provided proximate every $N^{th}$ row and every $M^{th}$ column of the first plurality of separately addressable pixel locations, and wherein N and M may be independently selected as any positive integer number between 1 and the maximum number of pixels in the row dimension for N and column dimension for M. The sensing elements, either alone or in combination with other elements, may operate as photon flux integrators.

Although in one embodiment, the sensing elements are provided for every pixel location, they need not be provided at every pixel, and may instead be provided with different locations. The provision may be different pixel spacings for rows and columns or at the same spacings. Embodiments, provide for example that the sensing elements are provided for every 2$^{nd}$, 3$^{rd}$, 4$^{th}$, 5$^{th}$, 6$^{th}$, 7$^{th}$, 8$^{th}$, 9$^{th}$, 10$^{th}$, 20$^{th}$, 50$^{th}$, or any other value of spacings between the values and at larger values in the row and column dimensions of the display. Alternatively, the sensing elements may be provided according to a predetermined or dynamically determined sensor spacing, pixel color, or other regular or irregular pattern.

The display may be a black/white, monochrome, or color display having a plurality of different color pixels. The plurality of different color pixels comprises red, green, and blue pixels or any other set of colors, particularly colors that provide a capability in combination of generating any color to a viewer of the display. The sensing elements may be provided only for pixels having a predetermined particular emitter color (such as red, green, and blue emitters), or may be provided for all emitter color pixels.

The pixel sensing elements may be unmodified or modified to be provided with a modification to the light blocking shield (dark shield). For example, the modification may be to provide a hole, aperture, or less opaque (more transparent) region so that some light may enter the pixel and strike the sensor. This hole or other modification is particularly useful to allow an external light signal to reach and be sensed or detected by the sensor, such as a brighter than ambient light from a light pen, or a darker than ambient light cast as a shadow by an opaque or only partially transparent or translucent object.

Embodiments of the invention may also or alternatively provide for some pixels to have a light blocking dark shield with out hole and other of the pixels to have a hole, aperture, or other modification so as to let in the light from outside the pixel and outside the display device. For example, the separately addressable pixels may include a light shield that attenuates at least a portion of photons from ambient light in at least some or the pixels (or all of the pixels) incident on the display from an external light source. The light shield may comprises a metallic substantially opaque layer or a non-metallic layer. The light shield may comprise a filter material that is spectrally neutral or spectrally selective so that broad spectrum ambient room or environment light (such as white light) is completely or substantially blocked or attenuated, while narrow spectrum light from a light input device (such as a 710 nm laser) is transmitted through the dark shield to the sensor or sensing elements. In one embodiment, different opaque shields and/or filters may be used differentially in different pixels.

The light shield may alternatively include a modification within, at, proximate, or near each of the photon sensing elements so that the attenuation of ambient light is a smaller attenuation that in the surrounding portions of the light shield. The modification may be an aperture in the light shield at each pixel location that permits photons from an external source to impinge on the photon sensing elements. The modification may be an aperture that has an area that is smaller than the area of the photon sensing element. The modification may be an aperture that comprises a hole in the light shield. The hole or aperture may be sized or dimensioned such that an appropriate amount of light (number of photons) reaches the sensor during a sensing or integration time so that a light or shadow input may be detected.

Figure 2:
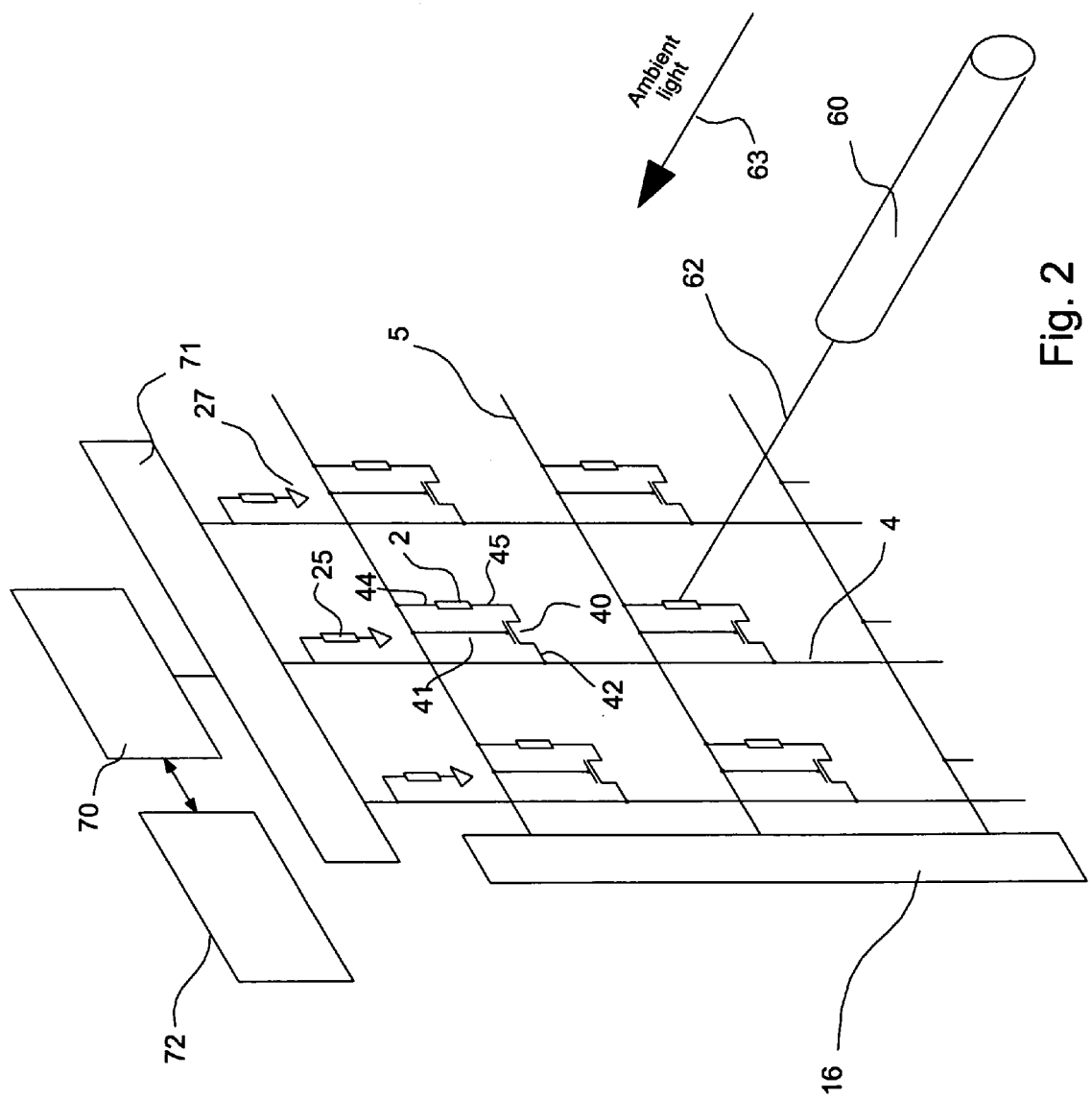
FIG. 2 is an illustration showing an embodiment of a passively driven OLED in dashed lines with a passive sensor array in black lines aligned on top of the OLED array.

FIG. 2 shows an embodiment of a functional schematic for using the sensor array 20 of sensors 2 as a light pen 60 input sensor device and system. Only device and circuit elements that participate in the operation of the light sensing device and system are shown and described here, and conventional device and circuit elements that are conventional in nature are not described here to avoid obscuring the present invention. Again, exemplary array matrix display light generating and pixel driving circuits and methods are described in the afore listed co-pending U.S. Patent Applications incorporated herein by references, or where conventional as are known in the art.

Data reader circuit 71 is connected to a voltage divider between voltage divider resistor 25 and sensor element 2 through isolation TFT 40. The voltage divider includes two resistances in series interposed between a voltage source and ground. The voltage drop from the voltage source to ground is the total voltage. The voltage, however, at a node between the two resistances is proportional to the total voltage as determined by the ratio of each resistor to the total resistance of the two resistors; for example, if a total resistance of two resistors in series between a 10 volt source and ground is 20 ohms and the 20 ohms is comprised of two resistors of ten ohms each, then the voltage at the node between the resistors is 10 volts minus 10 ohms divided by 20 ohms times the 10 volts and is equal to 5 volts. If the resistance of the resistor between the 10 volt source and the second resistor is reduced, for example to 5 ohms, then the voltage at the node between the resistors moves closer to the 10 volt source, namely to 10 volts minus 5/15 times 10 equal to 6.7 volts. If the optical resistor is the resistance interposed between the 10 volt source and the second resistor, then the resistance of the optical resistor depends on the intensity of the photon stream striking the optical resistor and thus the voltage at the node between the two resistors will move closer or further away from the 10 volt source depending on the luminance level.

It is therefore apparent that embodiments of the sensor array 20 may be used to sense the additional light over ambient projected from a light pen or other light emitting device or to detect the decrease in light relative to ambient caused by a shadow from an object such as a pointed stylus or other pointing instrument. The pixel sensor may therefore be used as a light or dark actuated input device. In one embodiment, the photon sensing elements are adapted to sense the photon wavelengths (energies) and luminance magnitudes emitted by a stylus carried external photon emitter, such as a light pen. In another embodiment, the photon sensing elements are adapted to sense a luminance magnitude received from the stylus carried external photon emitter that is higher than an ambient background luminance magnitude received by photon sensing elements not illuminated by the external photon emitter. In another embodiment, the photon sensing elements are adapted to sense a luminance magnitude received from the stylus carried external photon emitter that is lower than an ambient background luminance magnitude received by photon sensing elements not illuminated by the external photon emitter. The stylus carried external photon emitter may, for example comprises a light pen. The external photon emitter may comprises a light emitting diode (LED), an incandescent photon emitter such as a light bulb, or any other light emitting device.

In normal display operating mode, such as in an operating mode in which image or pixel data are sent to the display, the TFTs 40 in each row are line scanned. Therefore, when the first display array line (e.g. line one) is switched on, the isolation TFTs 40 in line one are turned on by a turn-on voltage, such as by a positive 10 volts (or other voltage), applied to the gate terminals 41 of TFTs 40 and concurrently or simultaneously to a first terminal end 44 of the optical sensors 2, which in the illustrated embodiment are two terminal 44, 45 optical resistors in series with TFT 40s. In the illustrated embodiment, the gate terminal 41 of the isolation TFT 40 is tied to the sensor 2 so that the optical sensor is in series between the drain 43 of the isolation TFT and the gate 41 of the isolation TFT 40.

As the OLED pixels in line one (and at the appropriate time any other line) ramp up in brightness (luminance), the resistance of sensors 2 decrease (or the conductance increases) causing the sensed voltages 30 at each of the voltage dividers to increase towards the positive 10 volts (or other turn-on voltage) supplied by selection driving circuit 16. In this embodiment, this sensed voltage 30 is used to determine when the pixels have attained the correct brightness (luminance). The action just described is known as addressing the first display line or line one. Once line one is addressed the scan moves to line two and so on until all lines (or any identified set of lines) have been activated with the image in the first frame.

There is a time period allotted to the addressing of each line. The address time is typically defined to be the reciprocal of the number of frames per second divided by the number of lines in the display. Therefore, in a QVGA display that has 240 lines and a frame rate of 60 frames per second the line address time is approximately 70 microseconds. The inventive system, device, and method may be used with a variety of display types and sizes so that the 70 microsecond addressing time is merely exemplary.

Advantageously, in order to use the sensor array 20 as a light pen 60 input device, a portion of the address time may be reserved as a period of time for the light pen input. For example, in a device, system, and method that has the exemplary 70 microsecond address time, the first 10 microseconds of line address time may be used for the light pen input. During this time (or a portion of this time), all the pixels in the line to be addressed are switched off so that no light emitted from the OLED or other display type pixels falls on the sensors 2 in the line being addressed. (It is understood that the OLED display is just one example of a display type that can benefit from this invention.) The fraction of time or an absolute period of time during which all the pixels in the line to be addressed are switched off so that no light is emitted from the OLED is determined based on such factors as the RC time constant comprised of the gate line enable line resistance (See for example, FIG. 13) times the total capacitances of all the gates of T1 and T3 in all the pixels in a row. Another factor is the RC time constant comprised of the data line resistance times the capacitance of C1. A typical RC constant for the gate enable line is 1 to 10 microseconds. A like RC constant would be applicable for the data line. These two RC constants need not be added together, because the lines may be active simultaneously allowing data to be transferred in a few microseconds. The operation of RC constants and how they apply to driving displays is well known by flat panel display designers.

For example, the period should be long enough that when considered with the amount of light (luminance or photo flux) the sensed signal will be sufficiently large but will not saturate the sensors 2. It is also advantageous that enough of the address time remain for displaying the image so that the display luminance is maintained at acceptable levels, but in general, the row addressing time is chosen to be only a small fraction (e.g. the reciprocal of the number of lines) of the on time of the pixel which is the length of one frame, and the amount of time reserved for image row addressing may usually have very little to do with the pixel or display luminance levels. (For example, for a 100 line display has about a one-percent row address time.)

The time allotted to touch sensing and image addressing, therefore may usually depend more on the time it takes to make a sense measurement and how long it take to transfer the image data to the pixel. For example, if it takes 10 microseconds to transfer image data and 10 microseconds to measure the sensor data. One would first have to make the pixel dark by erasing the previous imaging data from the pixel. In one embodiment, this amounts to transferring image data (a zero value) to the pixel to turn it off which consumes 10 microseconds and then one reads the sensor which will consume another 10 microseconds for a total of 20 microseconds for the sensor read portion. One then has the remaining address time to transfer image data, which we have assumed to be only 10 microseconds in this case. The 10 microsecond times are merely exemplary.

At this point any light on the sensors 2 in the line will be from light rays or photons 62 emitted from light pen or other light or photon emitting device 60. Data reader 71 reads the voltage developed at voltage divider resistor(s) 25 and the Sensed voltage data read is stored in data buffer 70, which may be any conventional data buffer known in the art. The data in data buffer 70 are then queried, read, and/or analyzed by software or other means located in a processing or computing section (or separate processor, computer, or other logic) 72. The inventive system, device, and method may incorporate the processing or computing section or may couple to and communicate with an external computing or processing environment. Details of the processing or computing section is not shown or further described here as such processing, computing, or other hardware and/or software and logic are well known in the art.

Once the data is read by data reader 71, data reader 71 is switched out of the circuit using any form of switch or switching logic and the system reverts to the normal display mode for the balance of 60 microseconds remaining in the address time. In one embodiment, the display is refreshed at a rate of 60 times a second. This refresh rate is much faster than is needed for the pen light input, where the input or movement of the light beam from the pen or other light source is being done at human manual movement rate which is on the order of from about 0.01 second to a few seconds, but more typically from about 0.1 second to about 1.0 second or equivalently from about 6 to about 60 frames for repeating the measurement. Note that while a user may be moving the penlight at a rate that is even faster than 0.1 seconds, a typical user will stop movement of the pen light 60 when intending to identify an input location on the screen. Longer or shorter periods may alternatively be used so that the invention is not limited to any particular range, and for example, it if is desired the input system be able to trace out a continuous movement, the light input sensing frequency may be increased as required to achieve the desired capture of the continuous movement.

This means that the data being read by data reader 71 can be updated many times during the use of the penlight; therefore, the sensed data may optionally but advantageously be integrated over time (or over a plurality of read cycles) to give a clearer and relatively noise free reading. If a higher read rate is desired such as when capturing a continuous movement or path, smoothing algorithms may optionally be applied to minimize any jerkiness in the curve that may result from noise. Also note that the information collected during the pen light input (or shadow input) time is a digital or binary input having either a one or zero value with no shades of gray required. Other embodiments of the invention may provide for a range of inputs or shades of gray so that the equivalent of a pressure or a location and some other data may be input.

It may be appreciated that any one of various different schemes for reading the sensors may be employed within the scope of the invention. These schemes may include any one among others, reading of the sensors during the display row addresses time, reading of the sensors during a frame dedicated to sensor input, reading of the sensors during a dedicated frame selected when the screen is touched, reading of the sensors during the vertical-retrace time, and/or reading of the sensors during the horizontal-retrace time.

In one embodiment the sensors are read during the display frame row address time. For example, the two-dimensional display array may be arranged as a frame having a plurality of rows and a plurality of columns, each of the rows has a row write address time during which a row of pixels is written and a frame time during which all pixels of the display including a plurality of rows and columns are written, and the sensing elements in each row are read during a portion of each row write address time. The reading may be accomplished during all or any portion of the row write address time. By way of example but not limitation, the portion of each row write address time may be any fraction between 0.001 and 0.5 of the row address time, any fraction between 0.01 and 0.2 of the row address time, any fraction between 0.01 and 0.1 of the row address time, or any fraction between 0.1 and 0.5 of the row address time.

In another embodiment the sensors are read during a frame dedicated to sensor input. For example, the two-dimensional array may be arranged as a frame having a plurality of rows and a plurality of columns; each of the rows having a row write address time during which a row of pixels is written and a write frame time during which all pixels of the display including a plurality of rows and columns are written; each of the rows having a row read address time during which a row of sensing elements are read and the row read address time occurs during a sensor read frame time that is separate from the pixel emitter write time; and all rows of sensing elements being read during a plurality of row read address times during a read frame time that does not overlap with the write frame time and the read frame time being dedicated to the reading or the plurality of sensing element.

In another embodiment the sensors are read during a dedicated frame selected when the screen is touched or illuminated by a light pen. For example, the plurality of sensing elements may be read during a dedicated sensor read frame. This dedicated sensor read frame may be caused to occur periodically or only upon the display screen receiving a predetermined input. For example, the predetermined input may be or comprises a physical contact with the surface of the display screen. The physical contact may comprises a physical touching by a finger or by a tool or stylus shaped object. The physical contact comprises a physical touching by a tool, a finger, or by a stylus.

Alternatively, the predetermined input nay be or comprises a predetermined magnitude change in a photon flux or luminance over a portion of the surface of the display screen, the predetermined input comprises a non-contact change in a parameter proximate the display screen surface. The non-contact change may be selected from the set of changes consisting of a localized temperature change, a capacitance or charge concentration change, a magnetic flux change, a localized higher or lower photon flux or luminance change, and/or any combination of two or more of these.

In another embodiment the sensors are read during the vertical-retrace time between successive display frames. Note that the vertical retrace time is the time between successive frames, and the horizontal retrace time is the time between sequential line (or row) writes. (Though not directly applicable to flat panel displays such as OLED displays, the vertical retrace time in conventional CRT displays is the time it takes for the electron beam to move from the bottom of the CRT tube to the top of the CRT tube.

For embodiments in which the sensors are read during the vertical-retrace time a separate or additional sensor line is advantageously provided. The circuit adapted for reading during the display vertical-retrace time is the same photon flux integrator circuit already described but with a modification. Instead of the TFT T3 (the sensor TFT) being connected to the same line (L2) that the gate line for T1 is connected, there is another separate gate line that is dedicated to TFT T3. With this structure, the regular feedback sensing for emission luminance control is performed during the line address time and then, when all the lines have been written, all the sensors are again read to sense any touch or light/shadow input before the next frame begins. Typically the vertical retrace time can be 10% to 50% of the total frame time but it may be longer or shorter. In one embodiment, therefore the sensing elements are read by a separate sensor line from those used to read the pixel emission luminance, and the reading of the sensor is controlled by a separate touch sensor line controlled through the gate terminal of a transistor.

In another embodiment, the sensors are read during the horizontal-retrace time. A separate sensor and control line may advantageously be employed for horizontal retrace time sensing. In one embodiment (See FIG. 11, for example) the gate line for T4 is connected to horizontal line L5, where line L5 is an additional line dedicated to operating the gate of T4 during the sensor reading.

The embodiment of the system and device illustrated in FIG. 2 shows the use of any pen light or light source 60 with no filtering of the light from the penlight. In this operating mode, the sensor array 20 is exposed to ambient light 63 as well as the typically higher luminance of penlight 62, or to the lower luminance of a shadowed portion of the display from an object placed on or positioned near the display screen face.

Figure 3:
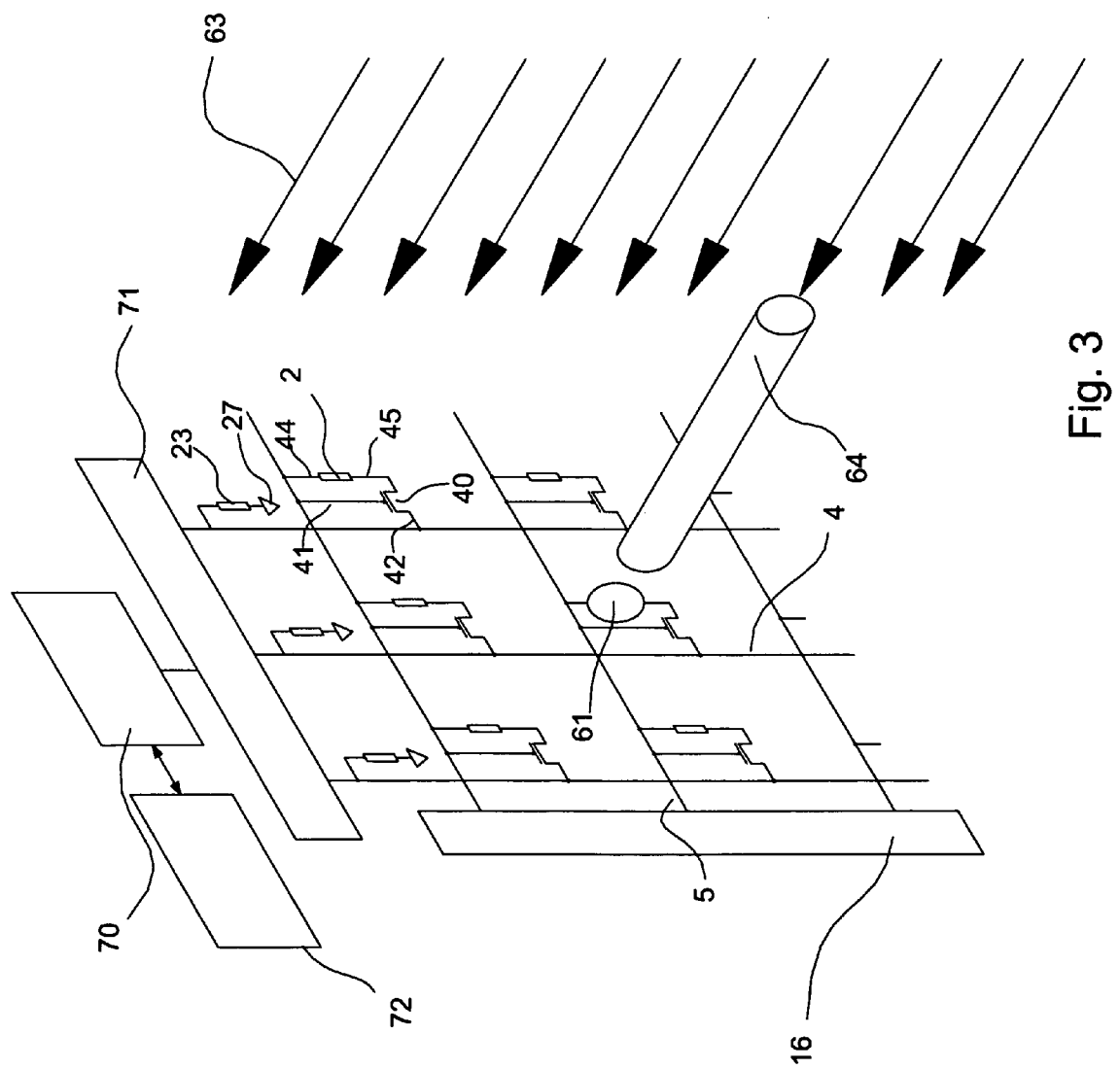
FIG. 3 is an illustration showing an embodiment of a sensor array with a laser pointer of penlight activating one of the sensors in the array.

By comparison, the embodiment illustrated in FIG. 3 shows the same sensor array structure but the use of an optically dense object 64 casting a shadow or attenuated signal 61 on one sensor 2 in the sensor array 20 and does not require a separate light source such as the light pen 60 emanating a beam of photons in an output beam 62. Processes for this shadowing implementation are substantially the same as for the above described light pen type of input, but the success of this shadowed embodiment depends on the relative difference in brightness (luminance) between shadow 61 and ambient light 63 on the sensors 2 of sensor array 20. Advantageously the optically dense object should have a fine point or otherwise permit localization of the shadow within a small area on the display. In one embodiment, the optically dense or opaque portion is only provided at the tip and the remainder of a stylus or handle that carries the tip is minimized or formed from optically transparent materials or from a structure that does not cast a strong shadow. Algorithms may optionally be applied to detect the terminal point or tip of a known stylus shape so that even when a shadow is cast from the stylus or handle, the intended input at the tip may readily be identified.

It will therefore be appreciate that in addition to devices and methods that sense an increase in luminance from a light pen or other light or photon emitting device, the sensors 2 and sensor array 20 may alternatively be used to sense a shadow input. In at least one embodiment, the device and method may simultaneously sense higher and/or lower luminance inputs relative to the background. In other embodiments, the user may alter a parameter for the display to change from a penlight input to a shadow input.

Therefore, according to at least one embodiment of the invention, the photon sensing elements may be adapted sense the photon wavelengths and energies and luminance magnitudes emitted by a stylus carried external photon emitter. In another embodiment, the photon sensing elements may be adapted to sense a luminance magnitude received from the stylus carried external photon emitter that is higher than an ambient background luminance magnitude received by photon sensing elements not illuminated by the external photon emitter. The stylus carried external photon emitter may comprise a light pen, the external photon emitter may comprise a light emitting diode (LED) or an incandescent photon emitter. In any of these embodiments, an optical system or train carrying refractive and/or refractive optics may be employed to shape or control the path of light and distribution of light at the display face or sensing elements. For example, an optical lens system may be employed to receive light emitted from an LED and focus a spot of light at a sensor plane at or below the front face of the display screen.

Figure 4:
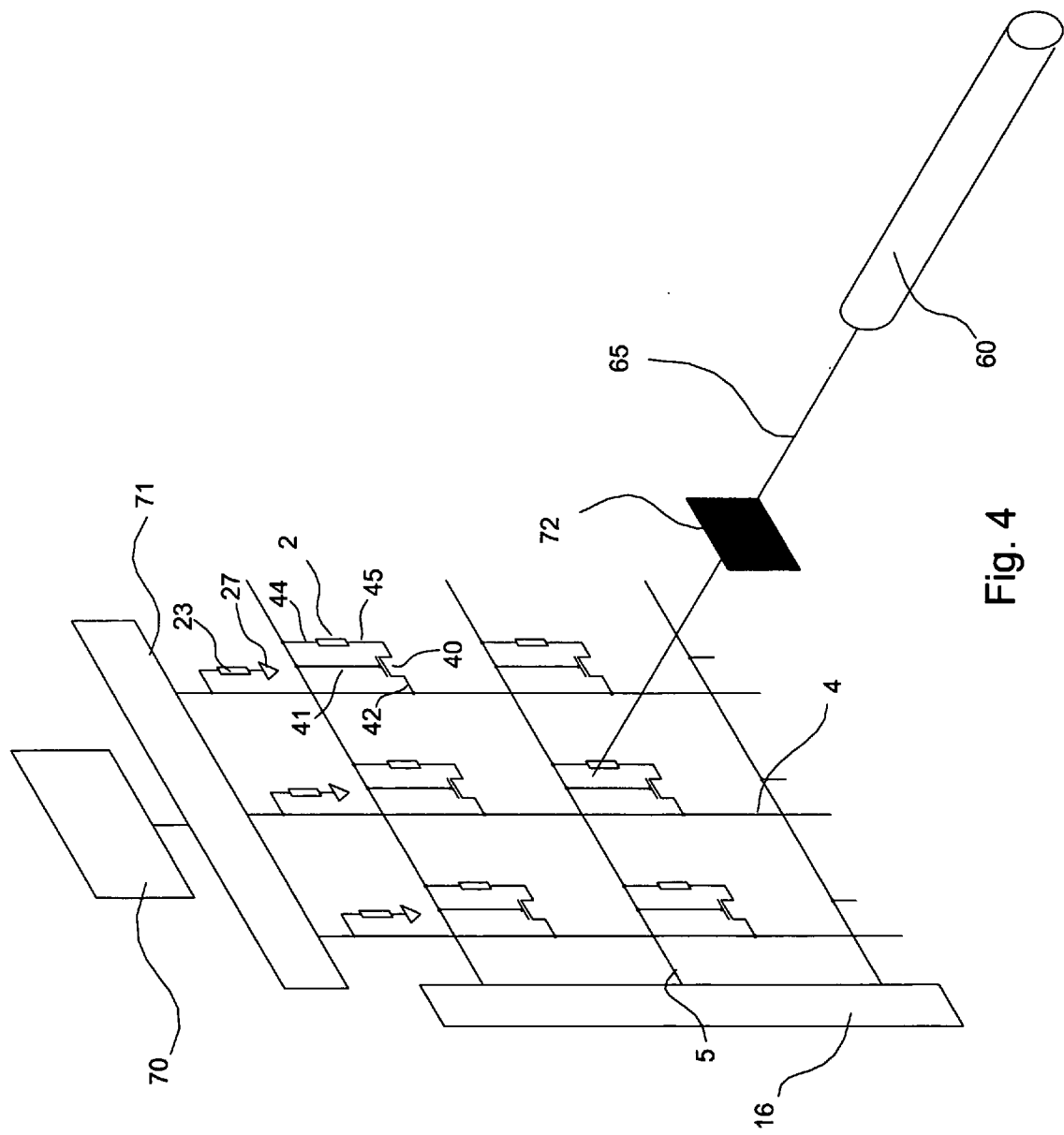
FIG. 4 is an illustration showing an embodiment of a sensor array exposed to ambient light, but shadowed by an optically dense object, which could be a finger or a stylus.

FIG. 4 shows an embodiment of the invention having the same or substantially the same sensor array and circuitry as that in the FIG. 2 and FIG. 3 embodiments, but where penlight 60 emits a narrow spectral wavelength band of light such as red light 65 (either because of a photon source emission characteristic and/or from spectral filtering within the penlight), which passes through spectral wavelength filter 72 and then falls on sensor 2 in the sensor array 20. Not shown is the construction of the penlight, which can employ in its construction an optical lens system that focuses the light from an LED or other source to a sharp point or a narrow waisted beam, which illuminates one pixel sensor at a time and produces very high resolution.

In fact, a high resolution optical system can be used to sense and provide a basis for recognizing handwriting. In one embodiment that uses a pen light for handwriting capture and recognition, the pen light or other light emitting stylus device it is held against the glass or other surface of the display so that a uniform or substantially uniform distance from the sensor array is maintained while the subject traces out a printed or cursive handwriting sample, such as a signature or any other written message. The use of the filter is employed as a dark shield that protects the sensor array from all or a portion of the ambient light. Various combinations of emitters and filters may be employed to provide a desired differentiation between the ambient light and the light pen or stylus light.

It will be appreciated that in at least one embodiment of the invention, the OLED pixel emitters are chosen so that a desired color display characteristic of the image may be generated. Because the same sensors 2 are used to sense the light pen input as are used to sense and maintain a desired brightness or luminance level of the display pixels, the pen light spectrum must fall within the spectral response of the sensors; however, the pen light emitter need not have the same spectral characteristics as the OLED or other display pixel emitters. The pen light spectrum may by way of example, be any monochromatic or polychromatic spectrum, and where the sensors 2 may sense a non-visible spectral component such as an infrared spectral component, such infrared pen light emitter may be employed.

It will be apparent in light of the description provided here that filters may be aligned with the sensors to block ambient light but let in light from a particular color directed laser or LED or from a particular color or spectral side light.

Directed and scattered side light embodiments are described elsewhere in this specification. Embodiments of the invention may therefore provide for a spectrally selective filter to be is disposed in the optical (light) path between a source of ambient light and a sensing element so as to block most of the ambient light that is not in the pass-band of the filter, but to transmit or pass light from an input light source. In one embodiment, the spectrally selective filter may be a filter that substantially transmits red light. In another embodiment, the substantial transmission of particular light may be a transmission of at least 50 percent, at least 70 percent, at least 90 percent, or at least 95 percent. In another embodiment, the substantial transmission is at least a transmission of between about 10 percent and about 100 percent.

The particular spectral light transmitted may be any color, such as red, green, blue, or any other color. In one embodiment, the spectrally selective filter is a filter that transmits photons having red wavelengths in the range between substantially 700 nanometers and 710 nanometers. In one embodiment, the spectrally selective filter is a filter that transmits photons having wavelengths in the range between substantially 400 nanometers and 800 nanometers.

In one embodiment, the ambient light that provides the input signal for pointing comprises light (photons) from a red side light contained in a plate by total internal reflection and directed into the sensing elements by alteration of a surface interface. In another embodiment, the ambient light that provides the input signal for pointing comprises light (photons) from a red laser light or a red light emitting diode directed into the sensing elements.

In one embodiment, the use of a color or spectral filter may be combined with any of the sensor read schemes. For example, in one embodiment of the inventive device and method, a spectrally selective filter is disposed in the optical (light) path between a source of ambient light or light input and a sensing element; a light input device emits at a wavelength within the pass band of the spectrally selective filter; and the photon sensing elements comprise sensors that are read during the display vertical retrace time.

Figure 5:
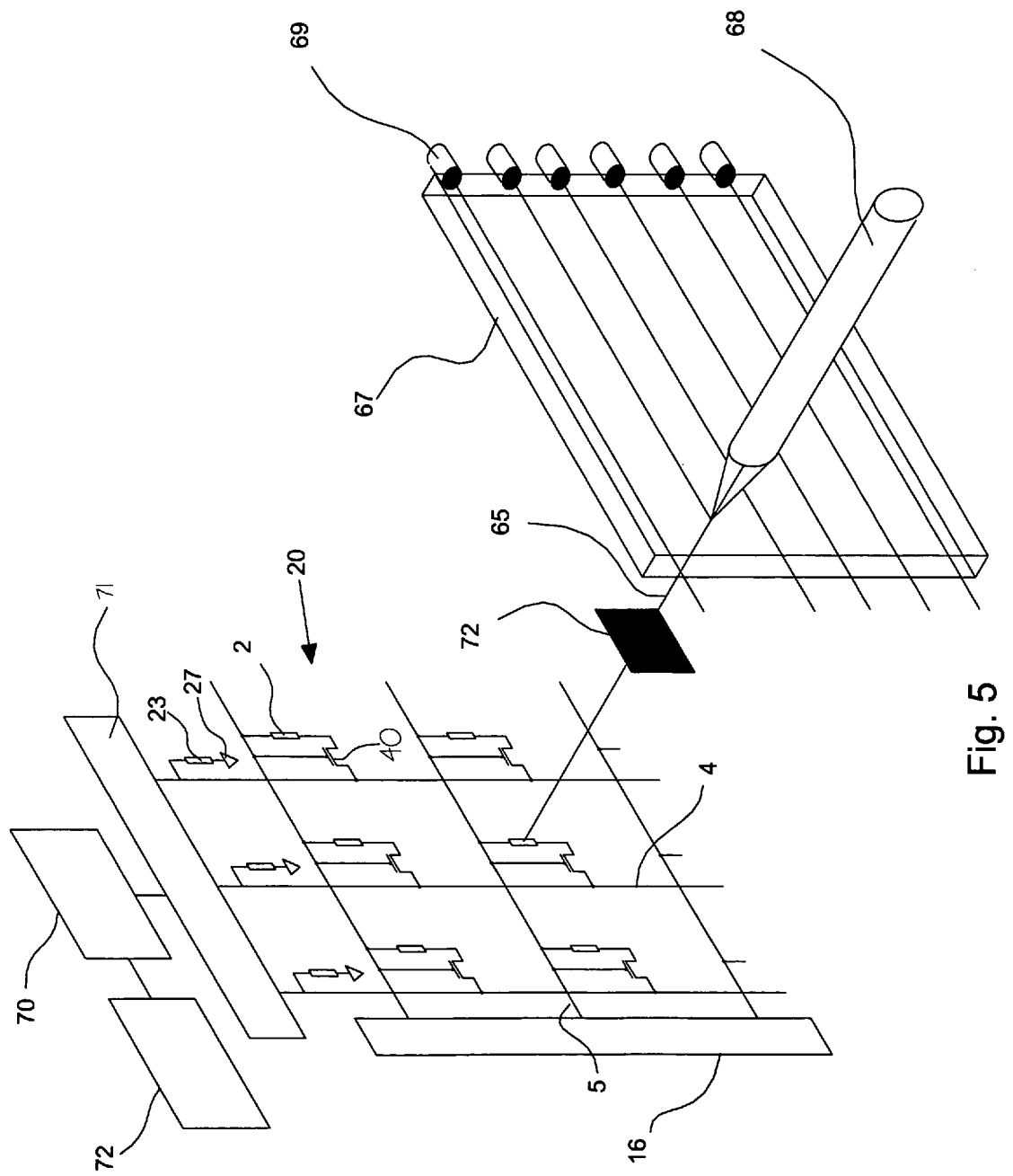
FIG. 5 is an illustration showing an embodiment of a sensor array with a red LED or laser penlight exposing a sensor in the array through a red filter.

With reference to FIG. 5, there is illustrated another embodiment of the invention in which a passive stylus 68 is used to input information to the sensor array 20. This system employs glass plate 67 (or any other transparent material) that has light 69 from an edge 66 of the glass plate 67. In one embodiment, the edge illumination is provided as red light from an array of red LEDs 69 introduced at one edge 66 of glass plate 67. As long as glass plate 67 or other transparent material has a relatively clean surface the red LED light passes straight through plate 67 without any light leaving the plate 67 and impinging on the sensor array 20. When the point of stylus 68 is pressed against glass plate 67 the change in optical density and index of refraction from air (where the stylus is not touching) to that of stylus 68 (where the stylus is touching) causes light to emerge or exit from the front surface of glass plate 67 and scatter off any surface near the point of exit including from the point of stylus 68 that caused the light to exit the surface, and a portion of this scattered light falls onto the sensor array 20 where it is detected by the sensors and associated sensing circuits already described. This system will operate in a lighted room or in a totally dark ambient environment, such as inside an automobile at night. Although a fine tipped stylus is illustrated, where only course pointing accuracy is required such as when selecting from plurality of displayed graphical icons, relatively larger pointing devices, such as a human finger tip may be used in place of the stylus 68.

Embodiments of the inventive device and method therefore may utilize pixels sensors in combination with a side or edge light traveling in a glass or polymer plate and a touching of a front glass or polymer plate that results in a redirection or scattering of the light to the sensing elements. For example, the display and method may provide a first plurality of photon sensing elements adapted to sense a background luminance magnitude not associated with an input from an external user and a different luminance magnitude that is associated with the input from the user, and where the different luminance magnitude may be a larger magnitude luminance (e.g. from a light source) or a smaller magnitude luminance (e.g. from a shadow). The larger magnitude luminance may be generated from a photon emitter located inside the display device that has a higher luminance than a diffuse background luminance incident on the surface of the display. The photons emitted from the photon emitter located inside the display device may be substantially completely contained within a first transmission medium (for example from the glass or polymeric plate) so that they do not impinge upon the sensor elements but the photons are caused to exit the first transmission medium at a user input location. The photons may be totally or substantially completely contained within a first transmission medium by total internal reflection within a plate disposed between the display emitters and the user and the photons are caused to exit the first transmission medium by altering a surface property or characteristic of the plate or by altering the plate surface interface from a second medium to a third medium.

In one embodiment, the second medium comprises a gaseous medium and wherein the third medium comprises a non-gaseous medium. This second medium may, for example, be air, or some other gas or fluid. The third medium may for example comprise a non-transparent, partially transparent, or substantially opaque passive attenuating object such as a solid substantially or partially opaque pointed stylus, pen-shaped object, pointing device, external human finger, or the like. In one embodiment, the photons caused to exit the first medium are scattered by the object external to the display so that at least a portion of the scattered photons are scattered or reflected back toward the display and impinge upon the sensor elements. The direction of the photons back toward the display and into the sensor elements may be by surface of the object.

Having now described a variety of sensing structures and methods it will be apparent that the inventive system, device, and method may utilize the pixel sensors in many ways, both for measuring and controlling pixel luminance and for sensing a touching or light input. The first plurality of photon sensing elements of the display array may be adapted to sense a luminance magnitude not associated with an input from an external user and a different luminance magnitude that is associated with the input from the user. This different luminance magnitude may be a larger magnitude or a smaller magnitude luminance. The larger magnitude luminance may be generated from an external photon emitter located outside the display device that has a higher luminance than a diffuse background luminance incident on the surface of the display and/or the smaller magnitude luminance is generated by a passive attenuating object having a transmission of less than 100% disposed proximate the surface of the display that generates a shadow and blocks or attenuates a portion of the diffuse background luminance incident on the surface of the display.

The invention is applicable to both active and passive display types. Passive arrays may typically be constructed without the complexity of building and providing TFTs as there are no TFTs required for passive displays, so that passive displays are less expensive to produce and highly economical in commercial systems and devices. In order for passive sensors and passive sensor arrays to operate as penlight input or other light or photon sensing devices, a means should be provided to locate the position of the light on the display panel from the penlight.

In one embodiment, the passive OLED display is line scanned in such a manner so as to have only one line on at a time. This operational feature provides the functional basis for a means for determining a first dimensional location (e.g. the vertical dimension or row location) of an input on the display since the lines are scanned in order from top (first row) to bottom (last row). Of course, the reverse order or any other order may be used and the invention adapted to that order, but this description will concentrate on the typical operation. Recall that these sensors may be operated as part of a display pixel luminance feedback system and method.

Figure 6:
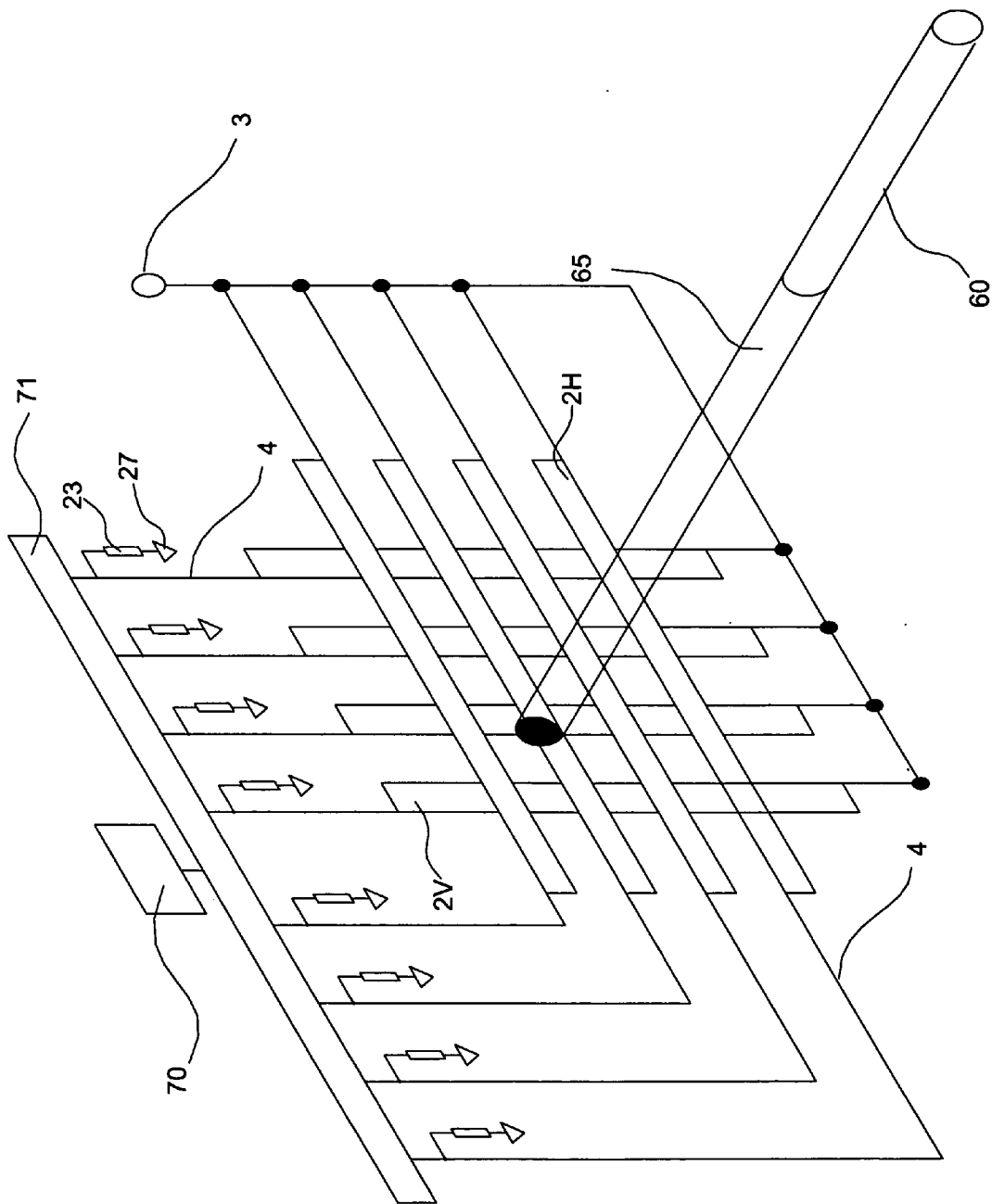
FIG. 6 is an illustration showing an embodiment of a sensor array using a glass plate that has red LEDs introducing red light at one edge of the glass plate with a stylus scattering red light through a red filter to activate one sensor in the array.

With reference to the embodiment illustrated in FIG. 6 since each column 75 of display pixels 76 in the passive display 77 has a strip or ladder sensor 2V running the length of each column 75, any light falling on the ladder sensor 2V will only be able to determine or identify the display column component of the location but not be able to determine the display row component of the location. When operating the passive display in the image display mode, the complete row and column location is fixed by pairing the line (or row) scan location with the column location, in contrast to the localization possible in the active display types.

In the strip sensor configuration as shown in FIG. 6 provides two strip sensors 2V, 2H that are disposed at a 90-degree angle with respect to each other. Therefore, there is one unique pair of sensor strips per display pixel. (Note that embodiments of the invention may not provide for a sensor element or ladder at each row and column when less than pixel pointing accuracy is required, such as an embodiment in which only every 10 rows and columns provide a sensor element.) When light falls on the display at least two sensor lines (one horizontal and one vertical) are illuminated, and the intersection of these sensor lines identify or pin-points the exact (x, y) or (row, column) coordinate location on the display.

Figure 7:
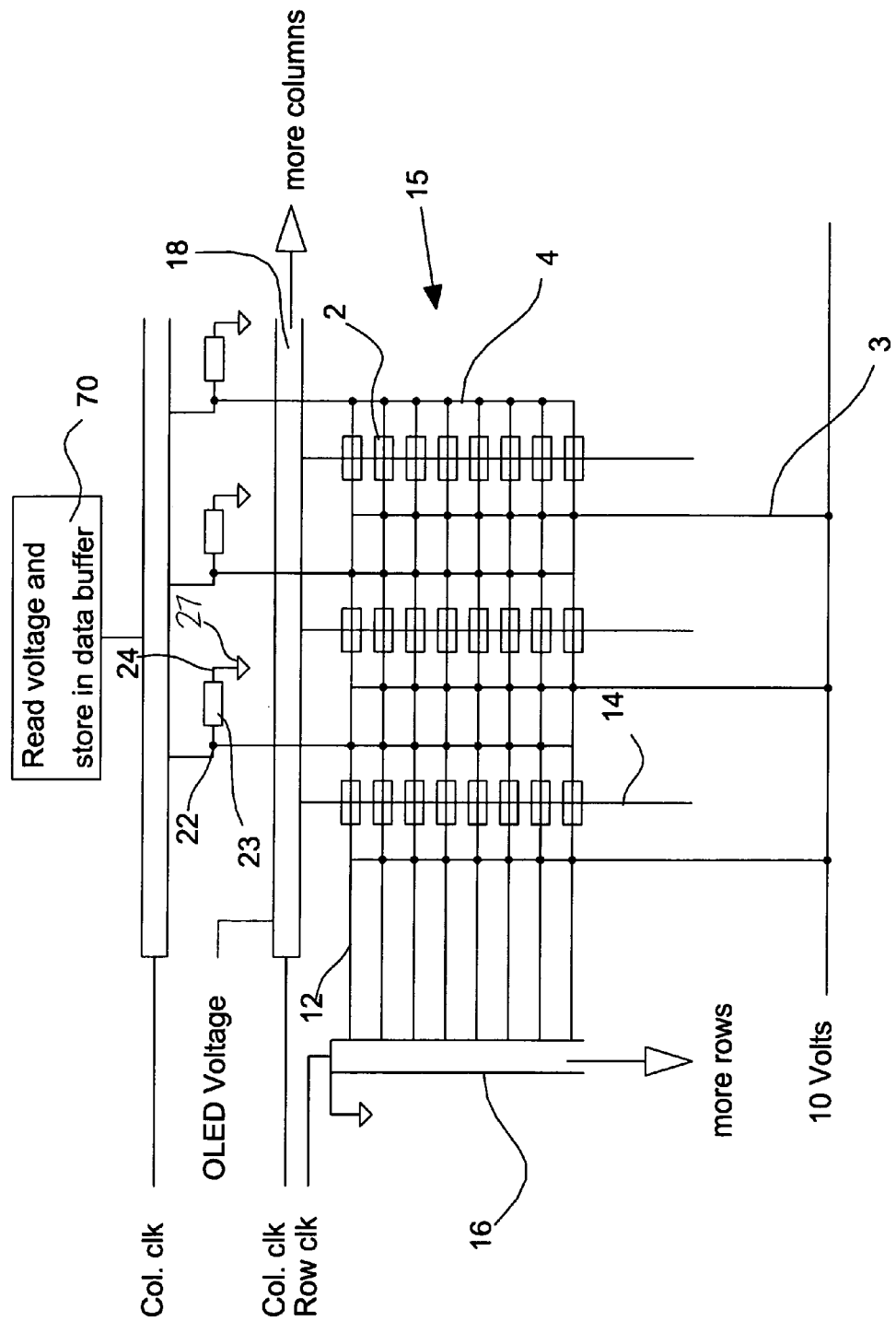
FIG. 7 is an illustration showing an embodiment of a sensor array employing sensors that extend down the full length of the column and a set of additional sensors orthogonal to the column sensors that extend the full width of the rows, and wherein a red penlight activates one column and one row so that the location of the penlight can be determined.

FIG. 7 shows an embodiment of a passive display having ladder sensors. Only the vertical input is shown and described here to avoid the complexity and possible confusion associated with showing both vertical and horizontal inputs. (This illustrated configuration cannot by itself therefore locate the user input but only can serve as an emissive feed back system ladder sensors and the set of horizontal sensors would be required for both as illustrated in the FIG. 6 embodiment. It will be understood that strip sensors and ladder sensors may be interchanged. A strip sensor may be seen to be a ladder sensor where the rungs of the ladder are thickened until they touch and form a continuous or essentially continuous strip.

This pairing of row and column locations may not always be available for the penlight input mode of operation because although the column number is easily determined when light from the penlight falls on the sensor array, no line number can be determined because all the lines (or rows) of the display are in the dark mode during the data input time (see above). To overcome this problem, a second set of horizontal strip sensors 2H are disposed on the sensor glass or substrate and oriented orthogonal to the vertical sensors 2V. In one embodiment, a dielectric layer (not shown) separates the first and second sets of sensors 2V, 2H. The first set of vertically oriented sensors determines the column location of the input and the second or orthogonal and horizontally oriented sensors determine the vertical location of the input.

FIG. 7 shows an embodiment of a passive array 15 containing sensor array elements 2. The dashed lines 12, 13 denote the OLED array in a layer or layers under the passive sensor array elements 2 or as a separate structure that aligned with the sensor array elements. In the illustrated embodiment, each of the sensors 2 in any particular column are arranged in the form of sensor ladders having sensor elements 2 connected between first and second conductors 3 and 4. Conductor 3 connects to a driveline at a driveline voltage (such as to a 10-volt or other defined voltage) and conductor 4 connects to a first terminal 22 of divider resistor 23, which in turn is connected at its second terminal 24 to ground 27. Each column has a set of sensors 2 in ladder form as described. There is one ladder per column of OLED emitters (indicated by crossed dashed lines). It is understood that the sensors 2 as illustrated may be either discrete interconnected sensor elements, or that the width (and/or other dimensions) of the sensors 2 may be increased until the rung-like sensors 2 touch or substantially touch and form a continuous strip of sensor material extending the length of the column (See for example, the embodiment illustrated in FIG. 6).

During the line address time for reading the pen light input data, the voltages at the voltage divider resistor 23 are input to data buffer 70 from the data reader circuit 71. As described above, there is not sufficient information with the structures illustrated in FIG. 7 to actually locate the position of the input data by both row and column. To accomplish this the complementary orthogonal set of sensors and circuits must be added. The configuration shown in FIG. 2 will only operate as a feedback system for the OLED but not operate as a complete penlight input system for this reason. The sensors and circuits illustrated in FIG. 6 illustrate a configuration that shows both orthogonal components to provide a complete penlight input system and device structure.

FIG. 6 is an illustration showing an embodiment for a configuration that will operate as a complete penlight input system. In this configuration the sensor ladders have been replaced by a plurality of crossed orthogonal vertical and horizontal single strip sensors 2V and 2H, one horizontal sensor 2H for each row and one vertical sensor 2V for each column. One side or terminal of the strip sensors is connected to voltage supply 3, such as to a 10-volt supply. The other side or terminal is connected to voltage divider resistors or other voltage divider circuits 23. Note that both vertical sensors 2V and horizontal sensors 2H may be connected to identically configured voltage dividers 23, one voltage divider resistor 23 for each horizontal and vertical line.

In the embodiment illustrated in FIG. 6, column 2 and row 2 are activated by light beam 65 from a pen light or other source. In one embodiment, the strip sensors 2V and 2H advantageously have an aspect ratio between a width and length of about 1000 to 1 (1000:1) wile in another embodiment the aspect ratio is about 40:1 or higher. As used here, the width dimension is the larger dimension that extends along a column for the vertical sensors 2V, and extends along the row dimension for the horizontal sensors 2H, so they will have high sensitivity. Other aspect ratios may be used without limitation so long as they have sufficient sensitivity for determining the location of the spot of light in both dimensions.

It is noted that one way to calculate the aspect ratio in to make one dimension the height or width of the display depending on whether one is making the calculation for the horizontal or vertical sensors. The other dimension is determined by how much of the pixel area one wants shadowed by the sensors. For example, if one arbitrarily assumes for purposes of simplicity of computation that a 100 column by 100 row display has 1 mm×1 mm pixels and one only wants to shadow 20% of the pixel area. Then each sensor line may only take up or occupy 0.1 mm of width so the horizontal sensor line takes up 10%, and the vertical sensor takes up 10%, for a total of 20% (approximately since the region where they cross has been counted twice). Since the total display height and width is 100 mm and the width of the sensor is only 0.1 mm the aspect ratio is 1000 to one in this example.

One of the important aspects of this configuration is that there are a sufficient number and orientation of strip sensors to locate the position of the light spot on the display. Conveniently, there are orthogonal horizontal and vertical sensor arrays permit such localization. In the afore described embodiment, the sets of strip sensors run orthogonal to each other. Therefore, light from 65 from penlight 60 falls on at least one vertical sensor 2V and at least one horizontal sensor 2H, which locates light 65 in an x-y matrix. All the other types of input revealed above will work with this configuration. The read out process for this passive display device implementation is the same or substantially the same as already described for the active display devices. Data read circuit 71 reads the voltages on the divider resistors 23 into data buffer 70 and data from the data buffer may then be read and analyzed by a computer, processor, or other logic coupled with the data buffer 70. Where light may fall on or spill over two other sensors some logic based on the strength of the sensor signals may be used by the computer, processor, or other logic to select a most likely location for the center of the spot.

The data buffer 70 and data reader 71 may be implemented in a variety of ways and many circuit forms may be implemented by persons having ordinary skill in the art, and therefore these circuits or other buffer or data reader means are not described in further detail here.

Figure 8:
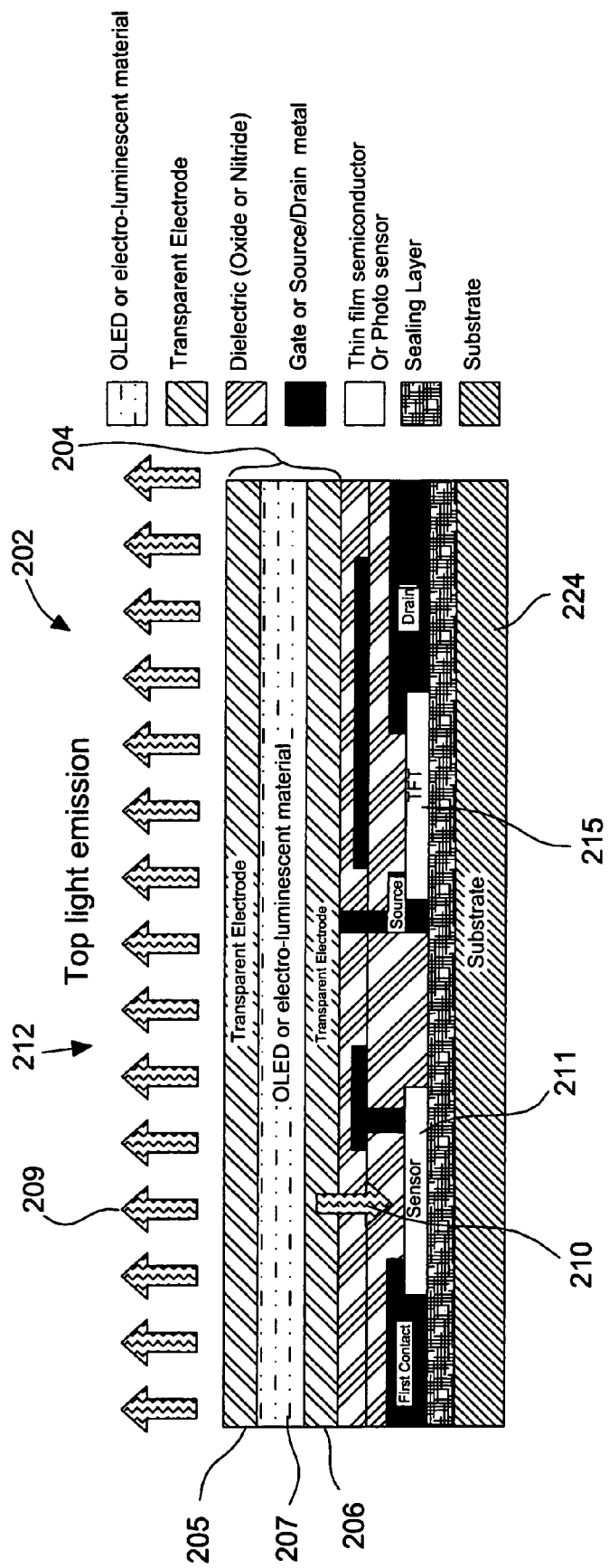
FIG. 8 is an illustration showing an embodiment of a top emission OLED pixel structure.

With reference to FIG. 8, there is illustrated an exemplary embodiment of a top-emission OLED pixel 202 structure. The OLED emitter 204 includes of two transparent electrodes 205, 206 that can be either cathode or anode. Light 208 generated by the OLED or electro-luminescent material 207 between the transparent electrodes emits in substantially all directions with Lambertian dispersion. Most of the light escapes up out the top 209 of the pixel and some proceeds downward (down arrow) 210 and strikes the sensor 211. Since the OLED material 207 is transparent or at least partially transparent, ambient light 212 may also pass through the transparent electrodes 205, 206 and the OLED material 207 to also strike the sensor 211. Therefore, the raw sensor data is a combination of OLED emitted luminance and ambient luminance levels. In order to separate or distinguish the two (emitted and ambient) luminance data stream contributions, the OLED emission 209 is turned off during the reading of the ambient luminance 212. Note that the OLED drive TFT 215 is a top gate structure; therefore, the gate 216 shields the TFT channel 217 from the emitted light from the OLED. An advantage of this structure is that nearly all the pixel area has OLED emitting surface while the TFT circuitry is tucked in underneath the OLED or other electro-luminescent emitter structure.

It will now be apparent that the inventive system, device, and method may provide the use of pixel sensors in an up-emitter or top-emitter structure. In such a structure, each of the separately addressable pixel locations comprises a photon emitter supported by a substrate surface and comprising a layer of emissive material sandwiched between a first transparent electrode and a second transparent electrode, the material emitting light upward through the first transparent electrode and downward through the second transparent electrode and toward the substrate; and the photon sensing element being disposed between the photon emitter and the substrate to intercept a portion of the downward emitted photons from the photon emitter. The emitters may comprise OLED emitters or other types of emitters.

Figure 9:
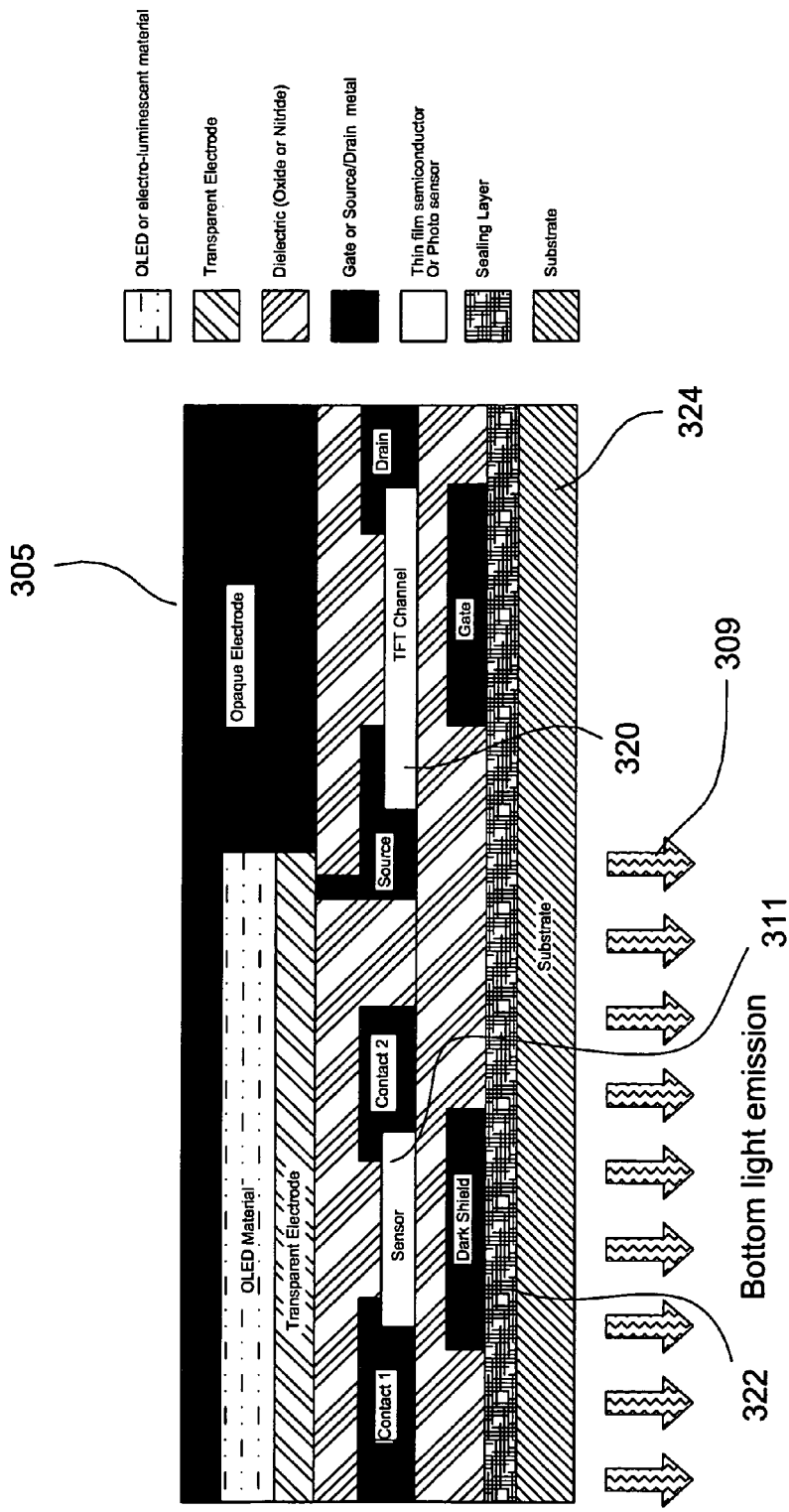
FIG. 9 is an illustration showing an embodiment of a bottom emission OLED pixel structure.

FIG. 9 illustrates an exemplary down-emission or bottom-emission OLED display pixel 302. In this embodiment, the top electrode 305 is opaque and light generated with Lambertian dispersion strikes the opaque cathode electrode 305 and is reflected downwards or back toward the OLED material 307 and exits the bottom of the structure through the transparent lower electrode 306 with the rest of the downward or bottom emitting light 309. Note that the OLED structure 302 in this embodiment does not extend over the current driving TFT channel 320 and that the sensor 311 is in the direct path of the OLED emitted light. The sensor, however, has a dark shield 322 protecting the sensor 311 from the ambient light that enters through the substrate 324; therefore, although the dark shield protects the sensor from ambient light that may otherwise disturb sensing and generation of an appropriate luminance feedback signal, this structure may not usually be suitable for a touch screen system as described herein elsewhere.

One possible disadvantage of the down- or bottom-emitter pixel architecture is that the emitting area of the pixel may usually be reduced as compared to a top emission pixel structure and therefore, the OLED must be driven to higher instantaneous emission levels to achieve the same external luminance, which may usually shortens its life time. The down or bottom emitter is the most common structure used for display at the present time, because the industry first developed an opaque cathode, but one which could not be appropriately structured due to processing difficulties. The industry is in a development mode to produce transparent cathodes and cathodes that can be appropriately structured. An embodiment of a down emitter suitable for use in a touch screen system is shown and described relative to FIG. 10.

It will also therefore be apparent that the inventive system, device, and method may provide the use of pixel sensors in a down-emitter or bottom-emitter structure. In such a structure, each of the separately addressable pixel locations comprises a photon emitter supported by a substantially transparent substrate surface and comprising a layer of emissive material sandwiched between a first opaque electrode and a second transparent electrode, the material emitting light downward through the transparent electrode and through the substantially transparent substrate; and the photon sensing element being disposed between the photon emitter and the substrate to intercept a portion of the emitted photons from the photon emitter. The emitters may comprise OLED emitters or other types of emitters.

Figure 10:
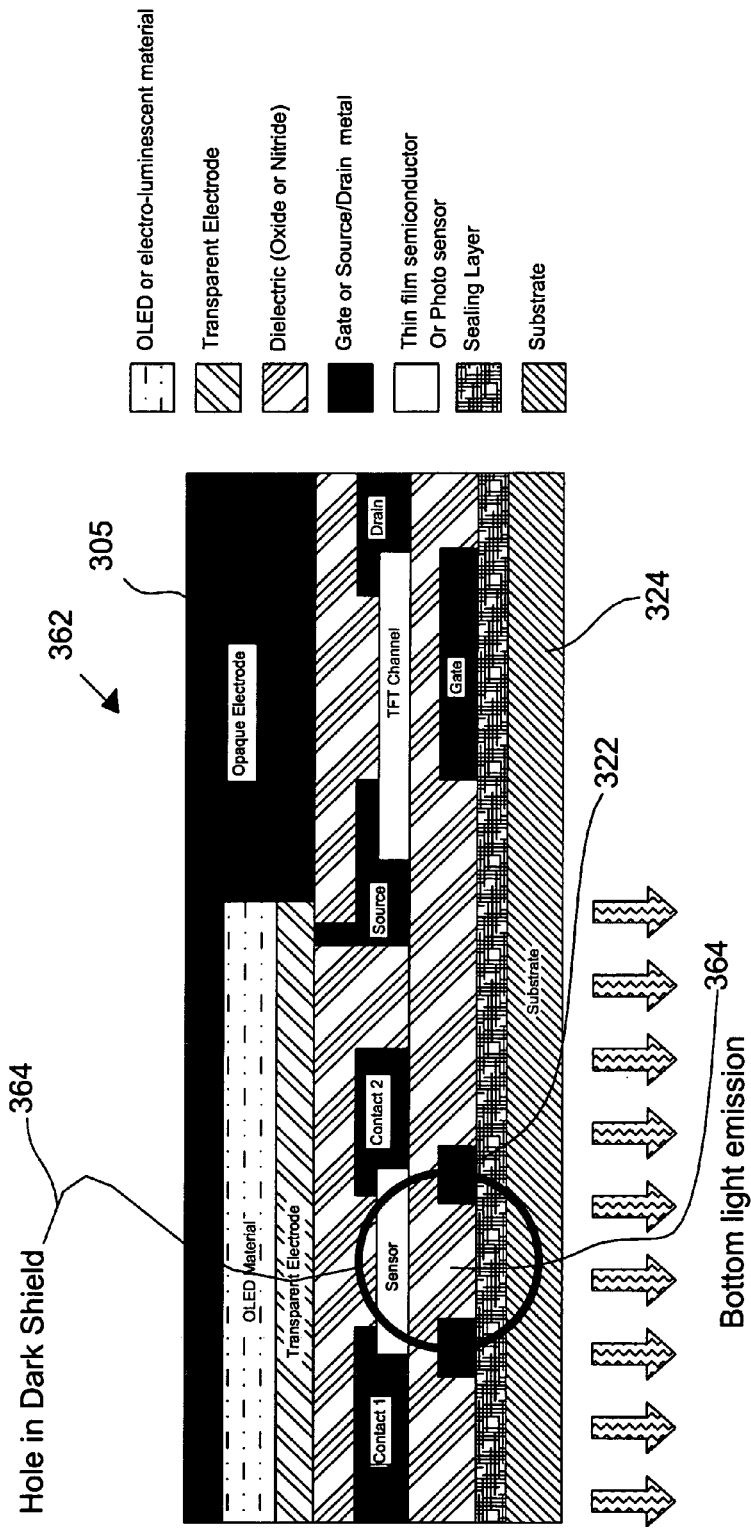
FIG. 10 is an illustration showing an embodiment of a bottom emission OLED pixel structure with hole in a light blocking dark shield to stop background ambient light.

An embodiment of a bottom or down-emission OLED display pixel 362 having a hole, an aperture, or other transparent or partially transparent region structured into a dark shield for a sensor is illustrated in FIG. 10. The structure may be substantially the same as the structure illustrated and described relative to FIG. 9 and similar structures are similarly numbered, except that that a hole, an aperture, or other transparent or partially transparent region 364 is structured into the dark shield to allow at least some ambient light to strike the sensor. In one embodiment, a hole 364 is provided in the dark shield 311 to permit a maximum amount of ambient light to strike the sensor 311. (The size of the hole 364 is not shown to scale relative to the size of the sensor.) In one embodiment, the hole is formed to expose between about 10 percent and about 50 percent of the sensor, but these ranges are not fixed and smaller and larger percentages may be used.

One alternative to the provision of a hole, aperture, or totally or partially transparent region, is to eliminate the dark shield 322 (as is done with the afore described top emitter structure). Without the dark shield the touch sensor or light pen sensor indicates where the shadow or light spot is by having a sensor reading the differs from the neighboring pixels. There is some advantage, however, associated with having the dark shield, which is advantageously formed from a metallic material (when biasing is desired), non-metallic material, or from a filter material that filters out most of the ambient light but does not filter out the wavelength of the pen light or other light input. The dark shield 322 should advantageously be biased and therefore, has characteristics of an optical transistor. The dark shield 322 when present and metallic, therefore, can be biased to minimize the dark current of the sensor 311. It is well known that TFTs have their lowest leakage at some voltage around zero, but not at zero. For example, the n-channel TFT has minimum leakage from about −3 volts to about −10 volts, while the p-channel TFT has minimum leakage at about a few volts positive.

Figure 11:
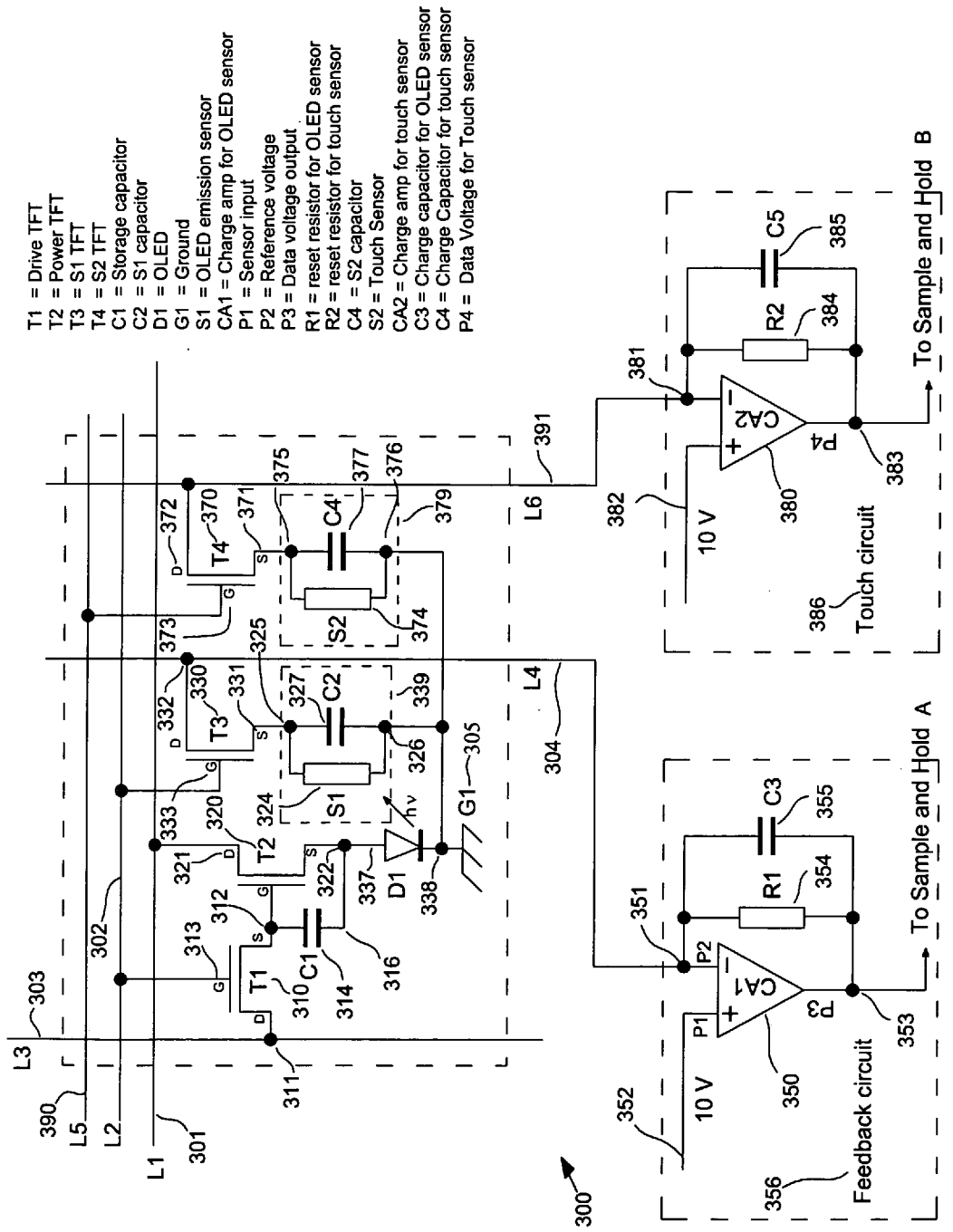
FIG. 11 is an illustration showing an embodiment of a two-sensor pixel circuit showing the sensors, a photon flux integrator, and the charge amplifier circuit used for reading the sensors.

With reference to FIG. 11, there is illustrated a pixel schematic for utilizing two sensors S1, and S2 in each pixel and two separate charge amp transimpedance amplifiers associated with the pixel and sensors. Sensor S1 is used to measure and generate a feedback signal for the pixel OLED emission data in order to stabilize the display emission properties. Sensor S2 is used in the touch screen system. This means that simultaneous measurement of OLED emission and ambient shadowing for sensing touch data can be accomplished.

A circuit similar to the circuit and structure illustrated in FIG. 11 is described in co-pending U.S. Utility patent application Ser. No. 11/015,638 filed 17 Dec. 2004 entitled Feedback Control System and Method for Operating a High-Performance Stabilized Active Matrix Emissive Display relative and FIG. 8 in that patent application, and which application is hereby incorporated by reference in its entirety.

Aspects of the structure and operation of this circuit are included here so that the manner in which the OLED emission sensor S1 and the touch/penlight sensor S2 operate may be more clearly understood. It will be appreciated that the present invention is not to be limited by the structure of any particular pixel emitter and emitter sensing structure and that alternative pixel emitter and emitter sensor structures may be practiced in conjunction with the present invention.

One aspect of the inventive pixel structure provides a conversion from high impedance to low impedance. The conversion from high impedance to low impedance occurs at least in part because of the structure, configuration, and/or operation of the emission sensor capacitor C2. The sensor S1 operation of charging or discharging the sensor capacitor C2 is a high impedance operation since the sensor has gig-ohms ($10^9$ ohms) of resistance. During this charging or discharging time, the sensor line is isolated from the high impedance by sensor S1 transistor T3. During the read time sensor transistor T3 is opened connecting the sensor capacitor C2 (which had been isolated from sensor line L4) to the sensor line L4.

Impedance between the sensor capacitor C2 and the sensor line L4 is only the resistance of the sensor line, which would normally be only about 3K ohms for typical implementations. The impedance difference is therefore on the order of one million to one ($10^6$:1). Interference from noise results in nano-amps of current flow which in a gig-ohm impedance system amounts to noise that is on the order of volts, but in a kilo-ohm impedance system amounts to micro-volts. Since it is the long length of the sensor line L4 in a typical display implementation that picks up the noise interference, a measurement should preferably not be made when the sensor line is connected to a high impedance system. When the sensor S1 is isolated by sensor TFT T3 any noise affecting the sensor S1 has to be picked up by the extremely short lines of the pixel circuitry; therefore, very little if any noise affects the charging or discharging of the sensor capacitor. These switching and impedance characteristics contribute to the successful operation of the pixel and sensor circuits.

Although particular pixel emitter, sensor, and circuit topologies are described relative to this pixel embodiment, it will be appreciated that the invention is not limited to only this particular circuit or device structures and that variations in the design and the particular electrical circuit devices may be modified, such as by changing the types of control devices to be other than particular transistors, TFT, diodes, or the like and substituting any two-terminal or three-terminal control or switching means. While the transistors are indicated as being TFT type transistors, the invention is not limited to only TFT type transistors. Furthermore, other alterations to pixel circuit topology, such as by adding additional circuitry may be made without departing from the spirit and scope of the invention. The type of emissive device may also be modified to be other than an OLED emitter and for example any active emitter may be used including but not limited to inorganic photon emitting devices or structures; and the characteristics of the sensor may be modified so that in addition to photoresistive or photoconductive devices, any sensor device that undergoes a change in response to incident photon flux may be substituted.

One of the advantages the circuit is that it provides a high-impedance to low-impedance conversion system for an emission feedback stabilized flat panel display, such as an OLED display. The circuit provides this by isolating the off display glass or substrate circuitry (such as voltage comparator amplifier VC1 and switching transistor TFT T4) from the high impedance of sensor S1 in the pixel during the emitted photon flux integration operation, which occurs during the frame time. The design of the circuit prevents noise on sensor line L4 that would result if sensor line L4 was connected to a high impedance source.

In this regard, it is well known that a conducting line connected to high impedance will pick up electromagnetic interference from the environment. This is easily demonstrated by observing the behavior of a volt meter with the plus and minus leads open in the air. The voltage will continually range from plus a few volts to minus a few volts due to radio and TV interference. Since sensor S1 has a resistance in the gig-ohm range and higher, it acts like an open circuit to sensor line L4, if L4 is connected directly to sensor S1 without benefit of sensor capacitor C2. During the sensor S1 photon flux integration time, sensor TFT T3 is turned off. While power supply line L1 is not isolated from sensor S1 in this particular pixel circuit configuration, noise on power supply line L1 does not affect the operation of the pixel or the display since power TFT T2 is operating in the saturation mode, and therefore changes of voltage (even on the order of volts) across power TFT T2 due to noise, does not change the current through TFT T2, and therefore the emission of photons from pixel diode emitters D1 for all pixels in the display remains stable.

Furthermore, any noise picked up by power supply line L1 fluctuates around zero volts (that is on average it has substantially equivalent positive and negative fluctuations about zero volts) during the frame time when sensor capacitor C2 is charging through sensor S1; therefore, the noise cancels out and the voltage on sensor capacitor C2 after the frame time is complete is due only to the discharge rate of sensor S1 when photons are intercepted. During the row address time when the voltage on line selection voltage line L2 goes high and turns on drive TFT T1 and sensor TFT T3, the voltage on emission sensor capacitor C2 is read by the voltage comparison amplifier VC1 at its sensor input on P1. This sensor input at P1 is compared with a reference voltage at P2 on its other input to generate a difference or error voltage at output P3. Noise does not interfere during the reading of the voltage present on sensor capacitor C2, because the current induced by noise is in the nanoampere range and at most may cause slight changes in the charge on capacitor C2, but since virtually no current goes though the high impedance no voltage results from the low level of noise interference.

The circuit is referenced to ground and to the voltage of Vcap 355 that is fed or communicated to sensor capacitor C2 327 through the sensor TFT T3 330 and TFT T4 340 transistors during the address time. An emissive device (such as an OLED diode) coupled to ground is driven by a controlled current source (such as a TFT transistor T2). The pixel data value in the form of a voltage is applied to the control terminal (TFT gate) so that the pixel emission (number of photons) is related to its intended integrated photon flux. Sensor S1 324 and a capacitor C2 327 are coupled as a photon flux integrator device 339 (along with supporting circuitry) with the pixel emissive element (OLED diode) so that a representative and measurable number of the photons emitted from the emitter are incident on the sensor and the combination of the sensor and capacitor generates a photon count. The sensor S1 and capacitor C2 combination integrates or counts the total number of photons it has collected during a defined period (in one embodiment the display frame time of 16.7 milliseconds). This integrated photon flux is a useful measure because it provides greater repeatability and immunity from noise than any instantaneous measure, provides a larger signal amplitude, and the integrated nature of the photon flux may likely be more representative of the integrated photon flux perceived by a human observer owing to the relatively slow response and latency of the human visual system.

A reference integrated photon flux has been established, and the sensor signal is then communicated to the control system and used with the reference to adjust the data signal that is applied to the control device during the next calibration period (such as the next frame) so that the actual pixel integrated photon flux (effectively photons emitted by the OLED diode or other emitter) matches the desired integrated photon flux (number of photons identified during calibration).

Having now described some functional aspects of the exemplary pixel circuit attention is now directed to a more detailed description of an embodiment of the circuit in FIG. 11. An embodiment of an display pixel with emitter, emission sensor, photon flux integration, and control components is now described relative to FIG. 11. A pixel diode drive transistor T1 310 is coupled to a image voltage line L3 301 at its drain ($D_{T1}$) terminal 311, to a first terminal 315 of storage capacitor C1 314 and to the gate terminal ($G_{T2}$) 323 of a power control transistor TFT T2 320 at its source ($S_{T1}$) terminal 312, and to a line selection voltage line L2 302 at its gate ($G_{T1}$) or control terminal 313. Power TFT transistor T2 320 is coupled to power supply voltage line L1 301 at its drain terminal 321. A second terminal 316 of storage capacitor C1 324 is coupled to the source terminal 322 of power TFT T2 320 and to the input terminal 337 of emitter (OLED diode) 336. The output terminal 338 of OLED emitter 336 is coupled to ground 305. The output terminal 338 of OLED emitter 336 is also coupled to a second terminal 326 of sensor S1 324 which is also is coupled to the second terminal 329 of sensor capacitor C2 327. A calibration read voltage (Vcal) is measured or read at a node defined by the connection of sensor S1 input at 325 and the sensor capacitor terminal 328. This read node is also coupled to the source terminal 331 of sensor TFT T3 330. Sensor TFT T3 330 is also coupled at its source terminal 332 to sensor line L4 304 which provides an input signal at an input port P1 351 of voltage comparator VC1 350. Voltage comparator 350 receives a reference voltage at a second input port 352 and generates a difference or error signal P3 353 computed as the difference between the P1 351 and P2 352 inputs. In this embodiment, the sensor output that is applied as an input to the voltage comparator VC1 350 is also applied at a common node 351 as the drain terminal 341 input of Vcap TFT T4 340. The source terminal 342 of Vcap TFT T4 340 is coupled to a capacitor charging voltage source (Vcap) 355, such as for example to +10 volts (or to any other voltage value), and receives a control signal 344 at its gate terminal 343. These transistors provide switching to connect pixel elements at times and to isolate other pixel elements at the same or different times so that tight management, control, and or measurement of small voltages, currents, charges, and/or photon counts may be precisely and accurately accomplished. Note that the sense of source and drain terminals of the TFT may be reversed depending upon the n- or p-type of material used for the TFT transistors.

While certain elements of the circuit described cooperate and contribute to operation of the pixel emitter, the pixel photon flux integrator, and the measurement and calibration operation, some approximate categories may be developed to assist the reader in understanding aspects of the invention; however, these categorizations are should not be applied to limit the scope of the invention as elements of the circuit described contribute to more than one category at some times and not at all at other times as described in detail in this specification. With this in mind, drive TFT T1, storage capacitor C1, power control TFT T2 and diode D1 may contribute primarily to operation of the OLED diode emitter; sensor S1, sensor capacitor C2, and sensor TFT T3 contribute primarily to the operation of determining or generating an integrated photon flux measurement; and voltage comparator VC1 and Vcap TFT T4 340 in this embodiment contribute primarily to reading the integrated photon flux measurement and determining a difference between that measurement and a reference so that a correction may be applied to adjust the pixel emitter luminance as indicated by the measured integrated photon flux.

Having described the general topology and connectivity of the circuit elements in FIG. 11, attention is now focused on its operation so that additional aspects and advantages of the invention will be better appreciated. A power source voltage ($V_{PS}$) typically in the range of 10 to 15 volts is applied to line L1 301, which serves as the power source for both OLED D1 336 and the charging source for sensor capacitor C2 327. The invention is not limited to any particular range and higher and lower voltages may be used consistent with device characteristics. At the same time, a line selection voltage ($V_{LS}$) is applied to line L2 302 causing data drive TFT T1 301 to turn on. Also at the same time an image voltage ($V_{IM}$) representing the image to be displayed and referred to as the image voltage is applied to line L3 303, and due to the fact that data drive TFT T1 301 is turned on (or conducting), this image voltage ($V_{IM}$) is delivered by TFT T1 to the gate $G_{T2}$ 323 of power control TFT T2 320 and storage capacitor C1 314. This causes a device current ($I_{D1}$) to be delivered by TFT T2 320 to OLED D1 336 and a specific light emission level is emitted from OLED D1 336 that is calculated to be the proper light emission ($E_{CALC}$) required by the image. When the display is new and freshly adjusted by the manufacturer the image voltages will produce the correct pixel/OLED emission values. In one embodiment, sensor S1 324 is physically located in contact with the semiconductor anode side of the OLED D1 336 for optimum optical coupling so that sensor S1 collects or intercepts at least a portion of the light emitted by OLED during its emission, and preferably as much of the emitted photons as possible so as to improve integrated photon count and signal strength. In terms of luminance, in this embodiment sensor S1 receives the same or substantially the same luminance as the OLED pixel emits, because the flux density striking the pixel (the sensor portion of the pixel) is the same as the flux density emitted by the pixel (the emitter portion of the pixel) as a whole because the portions are preferably (but not necessarily) in contact. (Other embodiments provide the sensor S1 to be physically located near the OLED so that it collects or intercepts enough light to provide useful sensor signals but not in contact with the anode side of the OLED D1.) In one embodiment, the sensor S1 is a photoresistive (or photoconductive) sensor in which the resistance decreases (or conductivity increases) with increasing photon flux density emitted by the OLED emitter.

During the frame duration ($T_{FR}$), which at 60 frames per second (fps) is 16.7 ms, the light emitted from OLED D1 336 impinges on sensor S1 324 and causes a resistance ($R_{S1}$) 347 component of the sensor S1 324 to decrease in proportion to the intensity of the light (photon) emission. During the display frame time, sensor capacitor C2 327 that was charged to a predetermined voltage through the sensor line by TFT T4 340 and a capacitor charging voltage source (Vcap) 355 is being discharged through sensor S1 324. The frame duration and the average resistance ($R_{ave}$) 348 of sensor S1 during the frame time determine the amount of charge discharged by sensor capacitor C2. The voltage on sensor capacitor C2 336 moves towards the ground voltage at G2 306 The amount of charge discharged by sensor capacitor C2 is an important parameter because it controls or determines the voltage ($V_{CAL}$) on the read calibration voltage node connected between sensor capacitor C2 328 and sensor TFT T3 terminal 331. Therefore, the greater the photon flux emission from OLED D1, the lower the resistance of sensor S1, the greater the current during the frame time discharge, and the lower the voltage remaining on sensor capacitor C2 when sensor capacitor C2 is measured during the read time. This read calibration voltage will be the read value sent to the circuit or other logic that determines the correction that is used to calibrate and maintain the uniformity and color balance of the display during normal operation. (Different embodiments of the invention provide different read circuits which are described elsewhere in this specification.) It is important to note that the lower the voltage measured at the read calibration voltage node between sensor capacitor C2 and sensor TFT T3, the greater amount of photon flux (pixel luminance) that was detected or intercepted by sensor S1.

In one embodiment, a second sensor S2 374 is coupled in parallel with sensor capacitor C4 377 to form a second separate photon flux integrator. The parallel combination of sensor S2 and sensing capacitor C4 are coupled at one node 376 to ground G1 305 and at the other node 375 to the drain of TFT T5 310. The gate 373 of transistor T5 receives an input from line L5 390 while the source terminal 372 of T5 connects to line L6 to communicate a sensed signal to the touch circuit 386 transimpedance amplifier circuit. The output of the touch circuit (or light input detection circuit) is communicated to a sample and hold circuit. This touch or light sensing circuit for inputs 386 operates substantially the same as the feed back circuit 356 and is not separately described in detail here.

The circuit in FIG. 11 here differs from the feedback system with the photon integrator circuits in U.S. Utility patent application Ser. No. 11/015,638 primarily in that there are two photon integrator circuits, the second photon integrator circuit include a second touch/penlight sensor S2 and touch/penlight sensor capacitor C4 for the touch/penlight sensor, rather than a single photon integrator circuit including OLED emission sensor S1 and OLED emission sensor. The first photon integrator circuit provides sensing for the OLED emission operation and the second photon integrator circuit provides sensing for the touch or light sensing.

Another difference is that the horizontal line L5 is added and controls transistor T4 independently of the transistors T1 and T3 in order to control TFT T4 which enables the reading of the touch sensor S2. Also vertical conductive line L6 is added as a dedicated readout line for the touch sensor. The embodiment of FIG. 11 also provides charge amplifiers that are used to read out the data from both sensors S1 and S2.

In operation 10 volts (or any other desired charging voltage) is placed on the plus lead terminals of charge amplifiers CA1 and CA2. This action causes, as is well known in the industry, the 10 volts to appear on L4 and L5. The voltage that appears at nodes P3 and P4 is close to zero and is called the offset voltage. When the gate terminals of T3 and T4 go high, that is, when line L2 and line L5 are energized, transistors T3 and T4 are recharged (or reset) to the 10 volts. The amount of charge required to do this is removed from charge amplifier capacitors C3 and C5 causing the voltage to drop on the negative lead of charge amplifiers CA1 and CA2. Since under these conditions there is a voltage difference between the plus and negative leads of charge amplifiers CA1 and CA2, a voltage equal to the difference plus the offset voltage appear at nodes P3 and P4. This voltage is sent to a sample and hold circuit (sample and hold circuits are well known in the industry and are not show or described in further detail here) for further processing.

It will be appreciated from the foregoing description that the invention includes structures and methods that provide for the same sensor (S1), sensor capacitor (C2), and photon flux integrator circuit elements to be used for feedback control of the pixel emitter luminance as well as for sensing a touch or light input. The invention also includes embodiments in which separate sensors (S1 and S2)), sensor capacitors (C2 and C4), and separate photon flux integrator circuit elements are used for feedback control of the pixel emitter luminance and for sensing a touch or light input. In the two sensor implementations, the device and method provides a plurality of first sensing elements for sensing a display pixel photon emission and for generating an integrated photon flux indicative of a pixel luminance; and a plurality of second sensing elements for sensing at least one of an external touch input and a external light input and for generating a signal indicative of the input. The use of two separate photon flux integrators provides an opportunity for additional flexibility in the time of reading the voltages, currents, or charges associated with the accumulated photon flux. In the single sensor and sensing capacitor embodiments, separate measurements may usually be made during non-overlapping time periods.

While many embodiments of the invention have been described it will be apparent in light of the description provided heretofore that one embodiment provides an emissive pixel display device of the type having a plurality of pixels, where each pixel has a light emitting device and a drive circuit generating a drive signal for driving the display pixels, the emissive pixel display device characterized in one way in that at least one photon sensor is disposed within a display device pixel and operated so that it senses photons emitted by an emitter within the pixel and ambient photons emitted by sources outside the display device, the sensed internally emitted photons being for display luminance feedback control and the sensed ambient photons being used to detect an external light source or sources or shadow input to the display.

It will also be apparent in light of the description provided heretofore that the invention further provides method, display, pixel structure, and emissive pixel device having an integrated luminance and input sensor, wherein the pixel device includes a light emitting device; a pixel emitter drive circuit generating a current to drive the light emitting device to a predetermined luminance corresponding to an image voltage and applying the drive current to the light emitting device during a frame time; at least one photo sensor that exhibits a change in electrical characteristic in response to a change in incident photon flux disposed near the light emitting device to: (i) intercept a measurable photon flux when the light emitting device is in an emitting state, and (ii) to detect a measurable photon flux from a source outside the pixel when the light emitting device is not in an emitting state; and at least one of a voltage, current, and charge reading circuit for measuring: (i) a first voltage across, a first current from, or a first charge generated by the photo sensor device at the end of a first portion of a non-emitting time period during a non-light emitting state, and wherein the measured first voltage, first current, or first charge being an indication of a measured luminance emitted from a source outside the pixel during the first portion of the time period; and (ii) a second voltage across, a second current from, or a second charge generated by the photo sensor device at the end of a second portion of an emitting time period during the light emitting state, and wherein the measured second voltage, second current, or second charge being an indication of a measured luminance emitted from the pixel during a second portion of the time period.

Figure 12:
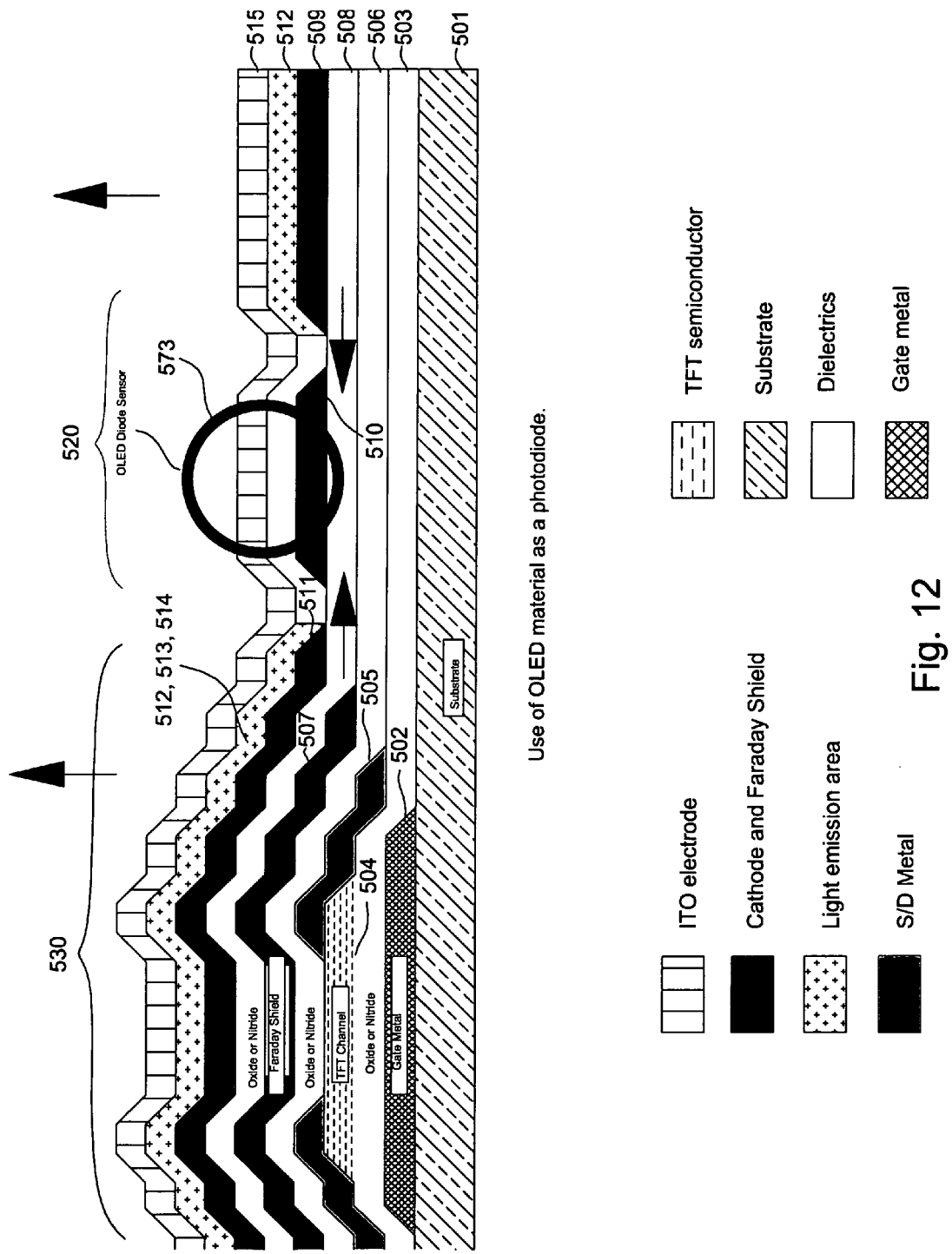
FIG. 12 is an illustration showing an embodiment of a top emission OLED pixel structure utilizing the OLED material as a reverse biased diode light detector as the sensor for both the emitted light and the ambient light for the touch sensor.

With reference to FIG. 12, there is illustrated in cross-section an exemplary OLED pixel 501 wherein a portion of the OLED material is used as a reverse-biased sensor or photo-diode. The structure of an OLED pixel may be used as a reverse biased diode for the purpose of measuring both OLED pixel emission light for pixel luminance stabilization and ambient light. (The illustrated embodiment in FIG. 12 is a top emitter structure, but a bottom emitter structure may alternatively be constructed according to the structures and principles described here.) Note that the black cathode layer 510 is interrupted on both sides of the OLED diodes structure 520 designated by the circle. This is so that the cathode 510 of the OLED diodes 520 can be biased independently of the light emitting OLED section 530.

Figure 14:
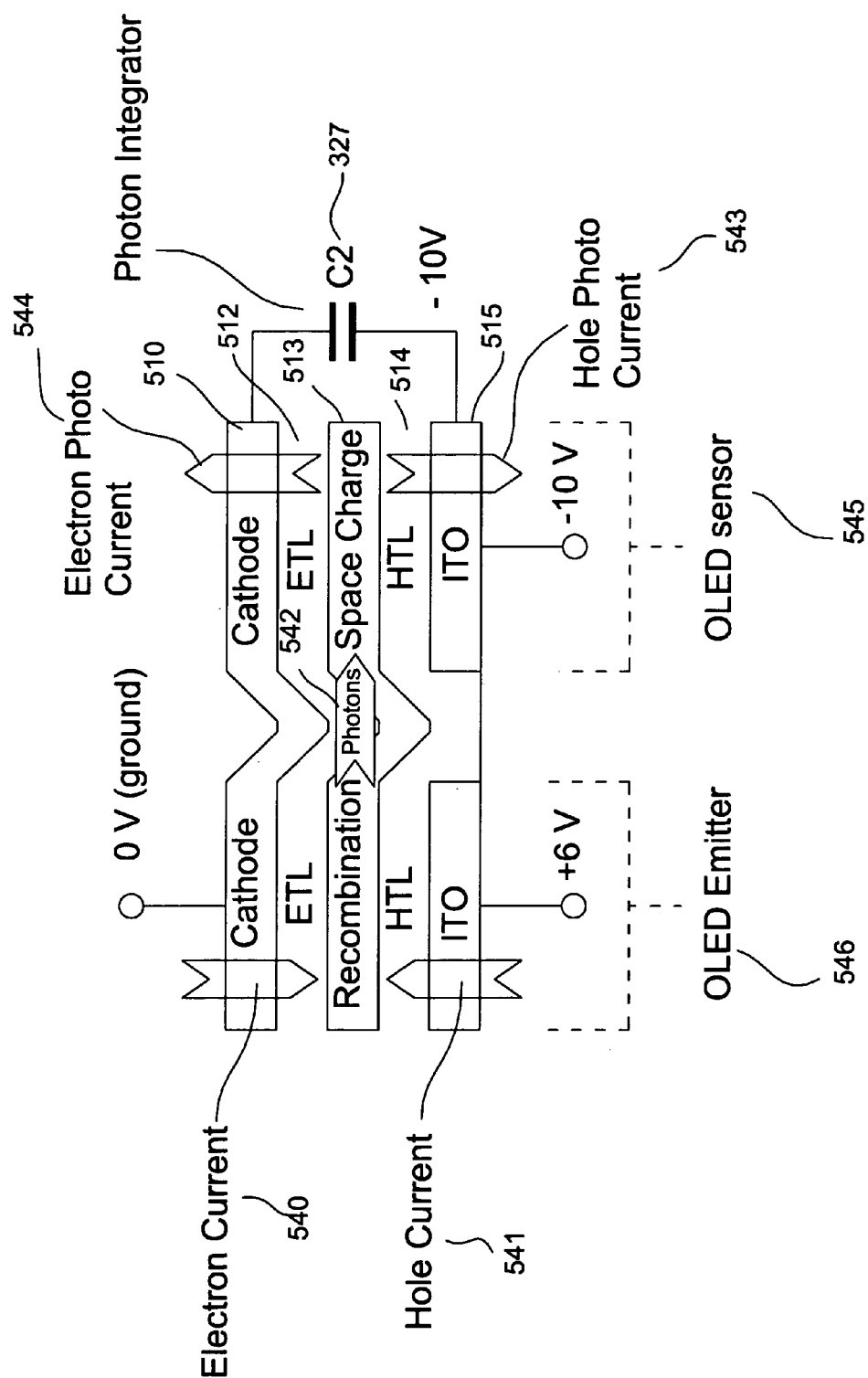
FIG. 14 is an illustration showing a schematic diagram of an OLED device including aspects of its biasing.

In order for an OLED to emit light, the OLED pixel is forward biased, and this forward biasing causes a hole current to flow in the hole transport layer (HTL) 514 (See FIG. 14 and an electron current to flow in the electron transport layer (ETL) 512 and combine in the Recombination layer 513. When the electron current 540 and hole current 541, combine light in the form of photons 542 is produced, the wavelength (color) of which is dependent on the energy difference between the holes and the electrons.

In this embodiment, the top layer is the cathode 510, and in this example the cathode 510 is biased at zero volts and is common to both the emitting section 530 and the sensing section 520 of the pixel structure 501. The next ETL layer 512 is also common to both the emitting section 530 and the sensing section 520 devices. The electron transport layer is followed by the recombination layer 513, where the emission of light 542 is generated by the recombination of electrons from the electron transport layer (ETL) 512 and holes from the hole transport layer (HTL) 514. The next layer down is the hole transport layer (HTL) 514. In this exemplary embodiment, there are two separate indium tin oxide ITO layers 515, 516. The ITO electrode 516 on the emitting portion of the OLED 530 has forward bias voltage (in this embodiment it is a +6 volts forward bias voltage) to forward bias the OLED into the emitting mode, while the ITO electrode 515 on the sensing part of the OLED has reverse bias (in this embodiment a −10 V reverse bias voltage) to reverse bias the sensing portion. As with any diode when it is reverse biased, a wide space charge region develops. When photons enter the space charge region, holes and electrons are generated, and immediately swept in opposite directions due to the high electric field developed in space charge region. This results in a photo current the magnitude of which depends on the photon flux entering the space charge region. This photo generated current is used to charge the flux integrating capacitor C2 in the manner described for example in co-pending U.S. Utility patent application Ser. No. 11/016,372 filed 17 Dec. 2004 entitled Active-Matrix Display and Pixel Structure for Feedback Stabilized Flat Panel Display, and hereby incorporated by reference.

Figure 13:
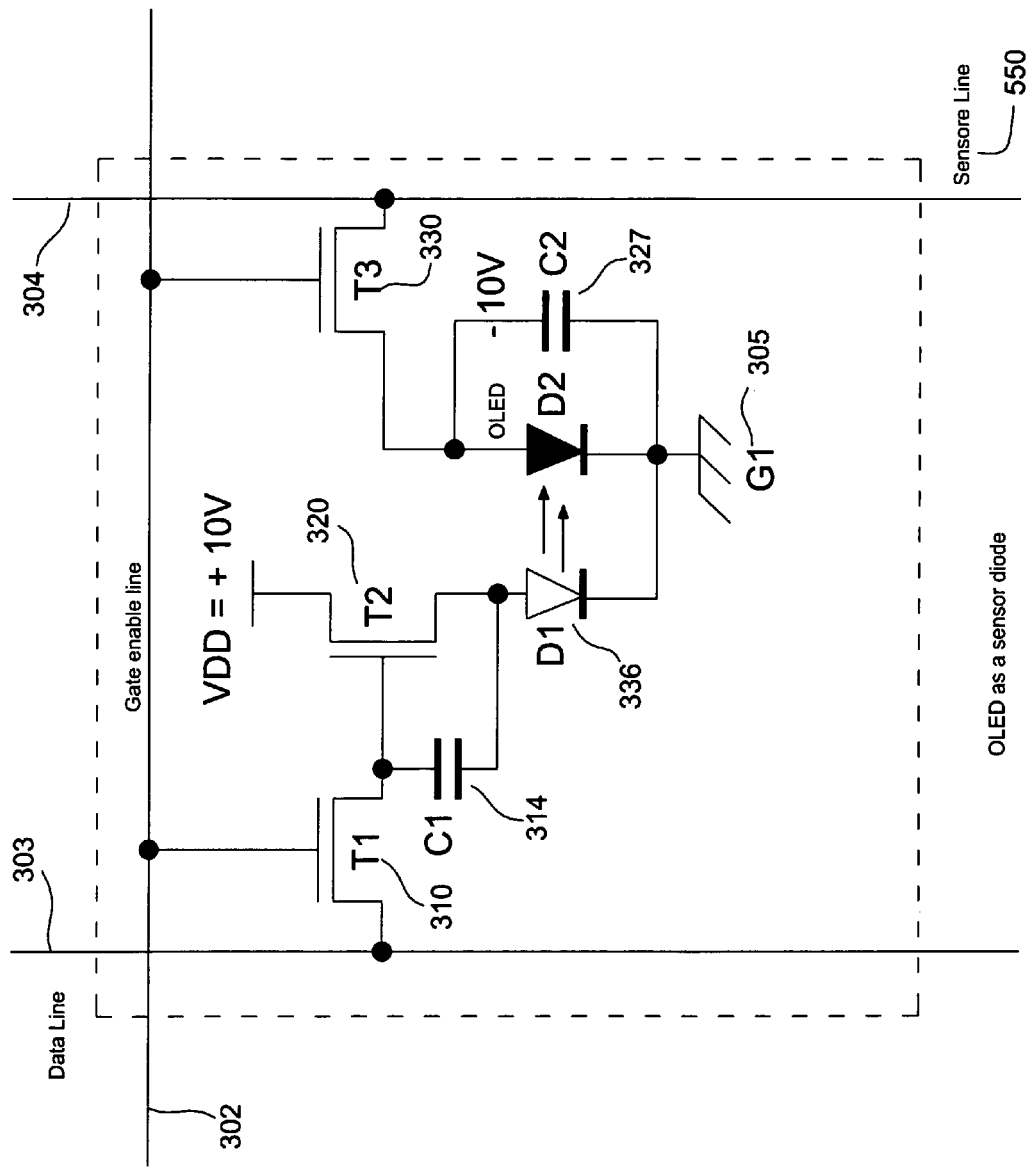
FIG. 13 is an illustration showing an embodiment of a pixel circuitry particularly showing the schematic for the reverse biased OLED optical diode.

FIG. 13 shows a pixel circuit schematic for an exemplary OLED diode sensor, such as for example a sensor corresponding to the pixel region 520 in FIG. 12. OLED devices may therefore be used as both photon emitters and photon sensors. In this case, the sensor line 550 delivers a negative sensor voltage through TFT T3. In this particular example, the negative voltage is −10 Volts but a different voltage may be used. Since reverse diode D2 is connected across capacitor C2, diode D2 will discharge capacitor C2 to ground. The rate at which D2 discharges capacitor C2 depends on the photons (luminance level) received by sensing diode D2 from OLED emitting diode D1. Therefore, the voltage remaining on capacitor C2 after the frame integration time corresponds to the average luminance level of diode D1 (or other sensing element) during the frame.

In order for an OLED to emit light, the OLED is forward biased which causes a hole and an electron current to flow into the emitting layer of the OLED structure, as illustrated in FIG. 14. This occurs in the OLED Emitter section of FIG. 14. In the Recombination area, light is generated when the hole and electron currents combine. The photon emission disperses substantially randomly in all directions so that a portion exits the recombination area laterally to the Space charge region of the OLED sensor section of FIG. 14. As the photons enter the Space charge region, electron/hole pairs are generated and separated into the indicated hole photo current and electron photo current. Capacitor C2 is the photon integrator capacitor which has been pre-charged to −10 volts. This is the charge that reverse biases the OLED sensor. As the photo current is generated, it reduces the charge across capacitor C2, because the positive photon hole current travels to the negative side of capacitor C2 and the negative photo electron current travels to the positive side of the capacitor C2. Eventually, all the charge in C2 will be cancelled by the photo generated currents. The size of capacitor C2 may usually be designed so that the maximum luminance from diode D1 will only result in a 90 percent discharge of capacitor C2; Therefore all levels of grayscale luminance emitted by diode D1 will leave the charge on capacitor C2 somewhere between full charge for grayscale zero and grayscale 255. Although in practical terms, this 90 percent discharge level works well, other discharge levels may alternatively be employed and will generate corresponding grayscale ranges.

Figure 15:
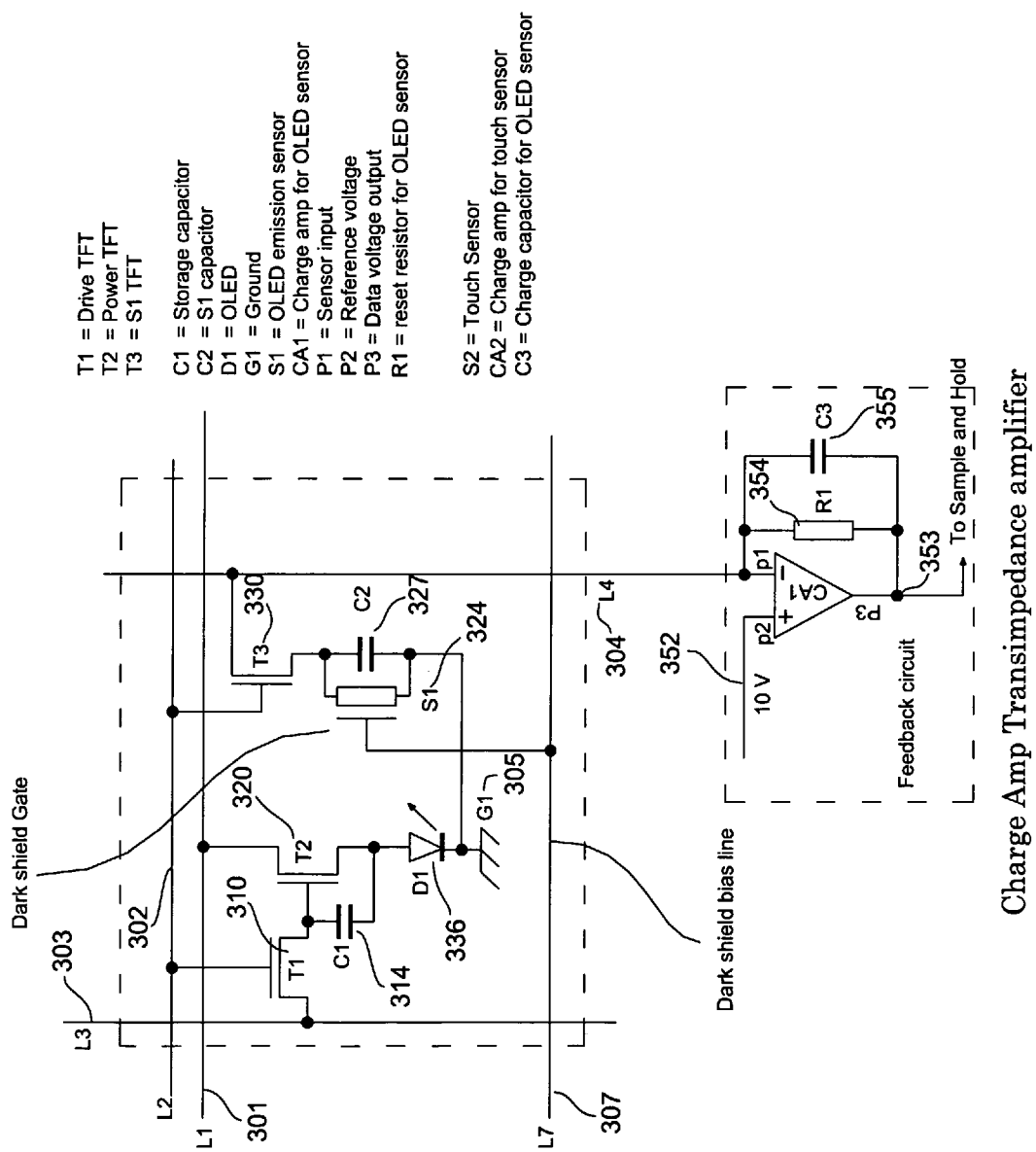
FIG. 15 is an illustration showing an embodiment of a sensor pixel circuit having a biased dark shield gate and dark shield bias line in addition to showing a sensor, a photon flux integrator, and the charge amplifier circuit used for reading the sensor.

With reference to FIG. 15 there is shown an embodiment of a sensor pixel circuit having a biased dark shield gate and dark shield bias line in addition to showing a sensor, a photon flux integrator, and the charge amplifier circuit used for reading the sensor. A single sensor implementation is illustrated here, however it will be appreciated that dual or multiple sensor configurations may be provided in analogy with the FIG. 11 embodiment.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram or schematic form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. An emissive pixel device having an integrated luminance and input sensor, the pixel device comprising:
   a light emitting device;
   a pixel emitter drive circuit generating a current to drive the light emitting device to a predetermined luminance corresponding to an image voltage and applying the drive current to the light emitting device during a frame time;
   at least one photo sensor that exhibits a change in electrical characteristic in response to a change in incident photon flux disposed near the light emitting device to:
   (i) intercept a measurable photon flux when the light emitting device is in an emitting state, and (ii) to detect a measurable photon flux from a source outside the pixel when the light emitting device is not in an emitting state;

at lease one of a voltage, current, and charge reading circuit for measuring:

(i) a first voltage across, a first current from, or a first charge generated by the photo sensor device at the end of a first portion of a non-emitting time period during a non-light emitting state, and wherein the measured first voltage, first current, or first charge being in indication of a measured luminance emitted from a source outside the pixel during the first portion of the time period; and (ii) a second voltage across, a second current from, or a second charge generated by the photo sensor device at the end of a second portion of an emitting time period during the light emitting state, and wherein the measured second voltage, second current, or second charge being an indication of a measured luminance emitted from the pixel during a second portion of the time period.

2. The emissive pixel device as in claim 1, further comprising:

at least one charge storage device coupled with the sensor for accumulating or releasing charges and exhibiting a capacitance charge and voltage proportional to the charge at a time; and a control circuit controlling the charging and/or discharging of at least one charge storage device in response to changes and/or discharging of the at least one charge storage device in response to changes in the electrical characteristics of the at least one photo sensor device during at least one of the emitting state and non-emitting state time periods.

3. The emissive pixel device as in claim 2, wherein the control circuit controls the charging and/or discharging of the at least one charge storage device in response to changes in the electrical characteristics of the at least one photo sensor device during the emitting state and non-emitting state time periods.

4. The emissive pixel device in claim 3, wherein the photo sensor device comprises a photo-responsive sensor.

5. The emissive pixel device as in claim 4, wherein the photo sensor device further comprises the at least one charge storage device.

6. The emissive pixel device as in claim 5, wherein the first voltage across, the first current from, or the first charge generated by the photo sensor device are measured based on a charge state of the at least one charge storage device.

7. The emissive pixel device as in claim 6, wherein the second voltage across, the second current from, or the second charge generated by the photo sensor device are measured based on a charge state of the at least one charge storage device.

8. The emissive pixel device as in claim 7, wherein the first emitting time period is a portion of the display frame time, and the second non-emitting time period is selected from the set of second time periods consisting of a portion of at least one of a row address time, a portion of a second frame time dedicated to measuring luminance incident upon the pixel that is a different frame time from the first time period, a portion of a time period for a display vertical retrace time, portion of a time period for a display horizontal retrace time.

9. The emissive pixel device as in claim 8, wherein the at least one charge storage device comprises separate first and second charge storage devices and wherein the first charge storage device provides an indication of the measured luminance emitted from the pixel during a portion of the first time period, and the second charge storage device provides an indication of the measured luminance incident upon the pixel during the second time period.

10. The emissive pixel device as in claim 9, wherein the voltage across, the current from, and the charge on the at least one charge storage device represents an integrated photon flux during the portion of the frame time over which the control circuit permitted charging or discharging or the charge storage device.

11. An The emissive pixel device as in claim 10, wherein the voltage, current, or charge reading circuit further comprising a comparator circuit that receives the voltage, current, or charge reading and a reference value corresponding to a target pixel luminance and generates a difference signal representing the difference between the target pixel luminance and the measured luminance.

12. The emissive pixel device as in claim 11, wherein the read circuit is configured as a charge amp/transimpedance amplifier having a charge amplifier circuit.

13. The emissive pixel device as in claim 8, wherein the voltage across, the current from, and the charge on the at least one charge storage device represents an integrated photon flux during the portion of the frame time over which the control circuit permitted charging or discharging or the charge storage device.

14. The emissive pixel device as in claim 8, wherein the light emitting device comprises a light emitting device selected from the set consisting of an organic light emitting diode (OLED) device, an electroluminescent device, a plasma emission device, and a controllable photon emissive device.

15. The emissive pixel device as in claim 8, further comprising comparison means for comparing the indication of the measured luminance incident upon the pixel during the second time period for a plurality of pixels in the display to identify a location where the measured luminance in an area is a predetermined magnitude greater than or a predetermined magnitude less than a measured luminance for adjacent or surrounding pixels.

16. The emissive pixel device as in claim 8, wherein pixels include a light shield that attenuates at least a portion of photons from ambient light incident on the display from an external light source.

17. The emissive pixel device as in claim 16, wherein the light shield includes an aperture or hole to permit at least a portion of photons from ambient light incident on the display from an external light source to enter the pixel.

18. A method of operating an emissive pixel device having an integrated luminance and input sensor, the method comprising:

generating a current to drive a light emitting device in each pixel to a predetermined luminance corresponding to an image voltage and applying the drive current to the light emitting device during the frame time;

providing a least one photo sensor that exhibits a change in electrical characteristic in response to a change in incident photon flux near the light emitting device in each pixel to: (i) intercept a measurable photon flux when the light emitting device is in an emitting state, and (ii) to detect a measurable photon flux from a source outside the pixel when the light emitting device is not in an emitting state;

reading at least one of a voltage, current, and charge measurement representing:

(i) a first voltage across, a first current from, or a first charge generated by the photo sensor device at the end of a first portion of a non-emitting time period during the non-light emitting state, and wherein the measured first voltage, first current, or first charge being an indication of a measured luminance emitted from a source outside the pixel during the first portion of the time period; and (ii) a second voltage across, a second current from, or a second charge generated by the photo sensor device at the end of a second portion of an emitting time period during the light emitting state, and wherein the measured second voltage, second current, or second charge being an indication of a measured luminance emitted from the pixel during a second portion of the time period.

* * * * *